(12) United States Patent
Kumazawa et al.

(10) Patent No.: US 12,133,339 B2
(45) Date of Patent: Oct. 29, 2024

(54) RESIN COMPOSITION, RESIN SHEET, MULTILAYER PRINTED WIRING BOARD, AND SEMICONDUCTOR DEVICE

(71) Applicant: MITSUBISHI GAS CHEMICAL COMPANY, INC., Tokyo (JP)

(72) Inventors: Yune Kumazawa, Tokyo (JP); Takuya Suzuki, Tokyo (JP); Seiji Shika, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 663 days.

(21) Appl. No.: 17/424,229

(22) PCT Filed: Jan. 17, 2020

(86) PCT No.: PCT/JP2020/001451
§ 371 (c)(1),
(2) Date: Jul. 20, 2021

(87) PCT Pub. No.: WO2020/153246
PCT Pub. Date: Jul. 30, 2020

(65) Prior Publication Data
US 2022/0071025 A1  Mar. 3, 2022

(30) Foreign Application Priority Data
Jan. 22, 2019  (JP) .................................. 2019-008389

(51) Int. Cl.
| | | |
|---|---|---|
| C08F 2/50 | (2006.01) | |
| C08G 73/10 | (2006.01) | |
| C08G 73/12 | (2006.01) | |
| C08J 5/24 | (2006.01) | |
| H05K 1/03 | (2006.01) | |
| H05K 1/09 | (2006.01) | |
| H05K 3/46 | (2006.01) | |

(52) U.S. Cl.
CPC ............. *H05K 3/4626* (2013.01); *C08F 2/50* (2013.01); *C08G 73/1003* (2013.01); *C08G 73/128* (2013.01); *C08J 5/24* (2013.01); *H05K 1/0366* (2013.01); *H05K 1/09* (2013.01); *C08J 2379/08* (2013.01); *H05K 2201/0154* (2013.01); *H05K 2201/0358* (2013.01)

(58) Field of Classification Search
USPC ......................................................... 528/170
See application file for complete search history.

(56) References Cited

U.S. PATENT DOCUMENTS

2019/0281697 A1   9/2019   Abe et al.

FOREIGN PATENT DOCUMENTS

| EP | 3 916 025 A1 | 12/2021 | |
|---|---|---|---|
| EP | 3915784 A1 * | 12/2021 | ............. B32B 15/08 |
| JP | 2005-062450 A | 3/2005 | |
| JP | 2010-204298 A | 9/2010 | |
| JP | 2015-229734 A | 12/2015 | |
| JP | 2016-060058 A | 4/2016 | |
| JP | 2018-062570 A | 4/2018 | |
| WO | 2011/021350 A1 | 2/2011 | |
| WO | 2018/056466 A1 | 6/2019 | |

OTHER PUBLICATIONS

JP6439338B2 Machine Translation (Year: 2018).*
International Search Report issued in International Patent Application No. PCT/JP2020/001451, dated Mar. 10, 2020, along with English translation thereof.
Written Opinion of International Searching Authority issued in International Patent Application No. PCT/JP2020/001451, dated Mar. 10, 2020, along with English translation thereof.

* cited by examiner

*Primary Examiner* — Terressa Boykin
(74) *Attorney, Agent, or Firm* — GREENBLUM & BERNSTEIN, P.L.C.

(57) ABSTRACT

A resin composition of the present invention contains: a maleimide compound (A) having a transmittance of 5% or more at a wavelength of 405 nm (h-line); a particular carboxylic acid containing compound (B); and a photo initiator (C) having an absorbance of 0.1 or more at a wavelength of 405 nm (h-line).

8 Claims, 1 Drawing Sheet

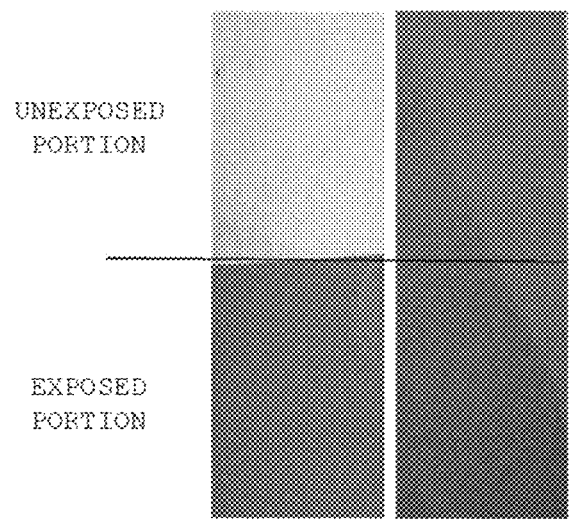

RESIN COMPOSITION, RESIN SHEET, MULTILAYER PRINTED WIRING BOARD, AND SEMICONDUCTOR DEVICE

TECHNICAL FIELD

The present invention relates to a resin composition, and a resin sheet, multilayer printed wiring board, and semiconductor device using the same.

BACKGROUND ART

Due to the downsizing and densification of multilayer printed wiring boards, studies to make the laminate used for multilayer printed wiring boards thinner have been actively carried out. Along with the thinning, the insulation layer also needs to be made thinner, and a resin sheet not containing glass cloth has been demanded. The resin composition used as the material of the insulation layer is mainly a thermosetting resin, and drilling of holes between insulation layers to obtain conduction is generally carried out by laser processing.

Meanwhile, the drilling of holes by laser processing has a problem that the processing time becomes longer as the number of holes in a high density substrate becomes larger. In recent years, therefore, there has been a demand for a resin sheet that enables batch drilling in the exposure step and the development step by using a resin composition in which the exposed portion can be cured by irradiation of ray of light or the like (exposure step) and the unexposed portion can be removed (development step).

As the method of exposure, a method in which a mercury lamp is used as a light source and the exposure is carried out via a photomask is used. Also, in recent years, the introduction of a direct imaging method, in which a pattern is directly drawn on the photosensitive resin composition layer without using a photomask, based on digital data of the pattern, has been progressing as the exposure method. Since this direct imaging method provides better alignment accuracy than the exposure method using a photomask and produces a highly detailed pattern, the introduction of this method has been progressing, especially for substrates that require the highly dense wiring formation. The light source for this method is a monochromatic light source such as a laser, and in particular, a light source with a wavelength of 405 nm (h-line) is used in devices based on the DMD (Digital Micromirror Device) system, which is capable of forming highly detailed resist patterns.

As the development method, alkaline development is used because it produces a highly detailed pattern.

For the photosensitive resin compositions used in laminates and resin sheets, compounds having an ethylenically unsaturated group, such as (meth)acrylate, are used in order to enable rapid curing in the exposure step.

For example, Patent Document 1 describes a photosensitive thermosetting resin composition containing a carboxyl modified epoxy (meth)acrylate resin, a biphenyl-based epoxy resin, a photo initiator, and a diluent, the carboxyl modified epoxy (meth)acrylate resin being obtained by reacting a bisphenol-based epoxy resin with (meth)acrylic acid and then reacting the resultant with an acid anhydride.

In addition, Patent Document 2 describes a resin composition containing a photocurable binder polymer, a photopolymerization compound having an ethylenically unsaturated bond, a photo (curing) initiator, a sensitizer, and a bisallylnadic imide compound and a bismaleimide compound, which are thermosetting agents.

As a photosensitive resin composition used in laminates and resin sheets, Patent Document 3 describes a resin composition containing a bismaleimide compound (a curable resin) and a photo radical polymerization initiator (a curing agent).

Patent Document 4 describes a resin composition containing a polyvalent carboxy group containing compound obtained by reacting a bismaleimide with a monoamine and then reacting the resultant with an acid anhydride, and a curable resin such as an epoxy resin. And, Patent Document 2 describes a polyvalent carboxy group containing compound that can produce a cured product having alkaline developability.

CITATION LIST

Patent Document

Patent Document 1: Japanese Patent Laid-Open No. 2005-62450
Patent Document 2: Japanese Patent Laid-Open No. 2010-204298
Patent Document 3: International Publication No. WO 2018/56466 (A1)
Patent Document 4: Japanese Patent Laid-Open No. 2015-229734

SUMMARY OF INVENTION

Technical Problem

However, cured products using conventional (meth)acrylate-based resins do not provide a sufficient physical property, and are limited in forming excellent protective films and interlayer insulation layers. In addition, in the unexposed portion, the alkaline developability is not sufficient and a highly detailed resist pattern cannot be obtained, which is problematic for use in high density printed wiring boards.

In the resin composition described in Patent Document 1 as well, the alkaline developability is not sufficient and a highly detailed resist pattern cannot be obtained, which is problematic for use in high density printed wiring boards.

In Patent Document 2, the use of a bismaleimide compound is described as a thermosetting agent, and (meth) acrylate is used as a photopolymerizable compound. Therefore, even the cured product obtained from this resin composition does not provide a sufficient physical property, and are limited in forming excellent protective films and interlayer insulation layers. Also, in the unexposed portion, the alkaline developability is not sufficient and a highly detailed resist pattern cannot be obtained, which is problematic for use in high density printed wiring boards.

In Patent Document 3, a bismaleimide compound is used as a curable resin, but since the maleimide compound normally has poor light transmissivity, when the maleimide compound is contained, light does not sufficiently reach the photo initiator. Due to the above, the photo initiator has difficulty in generating radicals, and its reactivity is very low. Therefore, in Patent Document 3, the maleimide compound is cured by additional heating before development, but since it involves heating, a highly detailed resist pattern cannot be obtained. In addition, the resin composition described in Patent Document 3 is not sufficiently alkaline developable in the first place, and thus the unexposed resin composition remains even after development. Accordingly, from this standpoint as well, Patent Document 3 cannot provide a highly detailed resist pattern and cannot be used for the production of high density printed wiring boards. Furthermore, in Patent Document 3, there is no description about using an active energy ray including a wavelength of 405 nm (h-line) as a light source that can be applied.

In order to obtain the polyvalent carboxy group containing compound described in Patent Document 4, it is necessary to react the bismaleimide with the monoamine and then react the resultant with the acid anhydride, which is a complicated process. Also, since an aromatic amine compound is used as the monoamine, this polyvalent carboxy group containing compound contains an amide group having an aromatic ring in its structure. Therefore, this polyvalent carboxy group containing compound has poor light transmissivity and inhibits the photocuring reaction, making it difficult to be used in photosensitive resin compositions in reality. Furthermore, although the use of a bismaleimide compound is described in Patent Document 4 as well, it is described as a curing agent and an epoxy resin is used as the curable resin, and thus there is a limitation in the formation of excellent protective films and interlayer insulation layers.

Therefore, the present invention has been made in view of the problems described above, and an object of the present invention is to provide a resin composition, and a resin sheet, multilayer printed wiring board, and semiconductor device using the same, wherein the resin composition is light-sensitive and photocurable when exposed with an active energy ray including a wavelength of 405 nm (h-line) and has excellent photocurability and alkaline developability, especially when used for multilayer printed wiring boards.

Solution to Problem

The present inventors have found that the problems described above can be solved by using a resin composition comprising a particular maleimide compound (A), a particular carboxylic acid containing compound (B), and a photo initiator (C) having an absorbance of 0.1 or more at a wavelength of 405 nm (h-line), leading to completion of the present invention.

More specifically, the present invention includes the following contents.

[1] A resin composition comprising: a maleimide compound (A) having a transmittance of 5% or more at a wavelength of 405 nm (h-line); at least one carboxylic acid containing compound (B) selected from a compound represented by the following formula (1), a compound represented by the following formula (2), a compound represented by the following formula (3), and a compound represented by the following formula (4); and a photo initiator (C) having an absorbance of 0.1 or more at a wavelength of 405 nm (h-line).

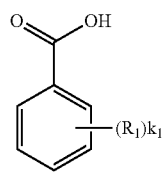
(1)

(In the formula (1), each $R_1$ independently represents a hydrogen atom, a hydroxyl group, a carboxy group, an amino group, or an aminomethyl group. Each $k_1$ independently represents an integer of 1 to 5. When the formula (1) has two or more carboxy groups, the formula (1) may be an acid anhydride formed by linking the two or more carboxy groups to each other.)

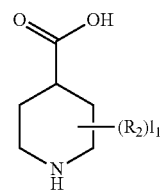
(2)

(In the formula (2), each $R_2$ independently represents a hydrogen atom, a hydroxyl group, a carboxy group, a carboxymethyl group, an amino group, or an aminomethyl group. Each $l_1$ independently represents an integer of 1 to 9. When the formula (2) has two or more carboxy groups, the formula (2) may be an acid anhydride formed by linking the two or more carboxy groups to each other. When the formula (2) has a carboxymethyl group, the formula (2) may be an acid anhydride formed by linking a carboxymethyl group and a carboxy group to each other.)

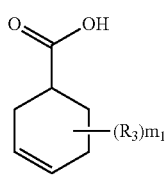
(3)

(In the formula (3), each $R_3$ independently represents a hydrogen atom, a hydroxyl group, a carboxy group, a carboxymethyl group, an amino group, or an aminomethyl group. Each $m_1$ independently represents an integer of 1 to 9. When the formula (3) has two or more carboxy groups, the formula (3) may be an acid anhydride formed by linking the two or more carboxy groups to each other. When the formula (3) has a carboxymethyl group, the formula (3) may be an acid anhydride formed by linking a carboxymethyl group and a carboxy group to each other.)

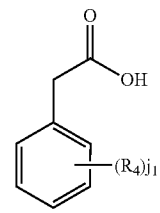
(4)

(In the formula (4), each $R_4$ independently represents a hydrogen atom, a hydroxyl group, a carboxy group, a carboxymethyl group, an amino group, or an aminomethyl group. Each $j_1$ independently represents an integer of 1 to 5. When the formula (4) has one or more carboxy groups, the formula (4) may be an acid anhydride formed by linking a carboxymethyl group and a carboxy group to each other. When the formula (4) has two or more carboxy groups, the formula (4) may be an acid anhydride formed by linking the two or more carboxy groups to each other. When the formula (4) has two or more carboxymethyl groups, the formula (4) may be an acid anhydride formed by linking the two or more carboxymethyl groups to each other.)

[2] The resin composition according to [1], wherein the carboxylic acid containing compound (B) is contained at 0.01 to 60 parts by mass based on 100 parts by mass of the maleimide compound (A).

[3] The resin composition according to [1] or [2], wherein the carboxylic acid containing compound is at least one selected from a compound represented by the following formula (5), a compound represented by the following formula (6), and a compound represented by the following formula (7).

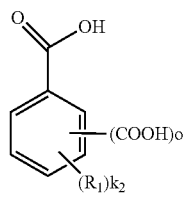

(5)

(In the formula (5), each $R_1$ independently represents a hydrogen atom, a hydroxyl group, an amino group, or an aminomethyl group. Each $k_2$ independently represents an integer of 0 to 4. o represents an integer of $(5-k_2)$. The formula (5) may be an acid anhydride formed by linking two or more carboxy groups to each other.)

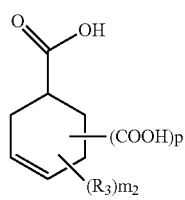

(6)

(In the formula (6), each $R_3$ independently represents a hydrogen atom, a hydroxyl group, a carboxymethyl group, an amino group, or an aminomethyl group. Each $m_2$ independently represents an integer of 0 to 8. p represents an integer of $(9-m_2)$. The formula (6) may be an acid anhydride formed by linking carboxy groups to each other. When the formula (6) has a carboxymethyl group, the formula (6) may be an acid anhydride formed by linking a carboxymethyl group and a carboxy group to each other.)

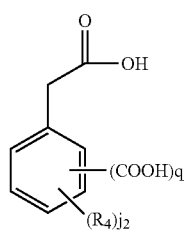

(7)

(In the formula (7), each $R_4$ independently represents a hydrogen atom, a hydroxyl group, a carboxymethyl group, an amino group, or an aminomethyl group. Each $j_2$ independently represents an integer of 0 to 4. q represents an integer of $(5-j_2)$. The formula (7) may be an acid anhydride formed by linking a carboxymethyl group and a carboxy group to each other. When the formula (7) has two or more carboxy groups, the formula (7) may be an acid anhydride formed by linking the two or more carboxy groups to each other. When the formula (7) has two or more carboxymethyl groups, the formula (7) may be an acid anhydride formed by linking the two or more carboxymethyl groups to each other.)

[4] The resin composition according to any of [1] to [3], wherein the maleimide compound (A) comprises a bismaleimide compound.

[5] The resin composition according to any of [1] to [4], wherein the photo initiator (C) comprises a compound represented by the following formula (8).

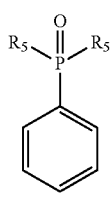

(8)

(In the formula (8), each $R_5$ independently represents a substituent represented by the following formula (9) or a phenyl group.)

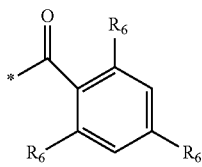

(9)

(In the formula (9), -* represents a bonding hand and each $R_6$ independently represents a hydrogen atom or a methyl group.)

[6] A resin sheet comprising: a support; and a resin layer disposed on one surface or both surfaces of the support, wherein the resin layer comprises the resin composition according to any of [1] to [5].

[7] The resin sheet according to [6], wherein the resin layer has a thickness of 1 to 50 μm.

[8] A multilayer printed wiring board comprising:
an insulation layer; and
a conductor layer formed on one surface or both surfaces of the insulation layer,
wherein the conductor layer comprises the resin composition according to any of [1] to [5].

[9] A semiconductor device comprising the resin composition according to any of [1] to [5].

Advantageous Effects of Invention

According to the present invention, a resin composition, and a resin sheet, multilayer printed wiring board, and semiconductor device using the same can be provided, wherein the resin composition is light-sensitive and photocurable when exposed with an active energy ray including a wavelength of 405 nm (h-line) and has excellent photocurability and alkaline developability, especially when used for multilayer printed wiring boards.

BRIEF DESCRIPTION OF DRAWING

FIG. 1 shows photographs after alkaline development carried out using the resin sheets obtained in Example 1 and Comparative Example 1.

DESCRIPTION OF EMBODIMENTS

Hereinafter, an embodiment for carrying out the present invention (hereinafter, referred to as the "present embodiment") will be described in detail. The present embodiment described below is only illustrative of the present invention and is not intended to limit the present invention to the contents of the following description. The present invention can be carried out with appropriate modifications falling within the gist of the invention.

Note that, in the present specification, the term "(meth) acryloxy" refers to both "acryloxy" and "methacryloxy" corresponding thereto, the term "(meth)acrylate" refers to both "acrylate" and "methacrylate" corresponding thereto, the term "(meth)acrylic acid" refers to both "acrylic acid" and "methacrylic acid" corresponding thereto, and the term "(meth)allyl" refers to both "allyl" and "methallyl" corresponding thereto. Also, in the present embodiment, the term "resin solid content" or "resin solid content in a resin composition" refers to components in a resin composition excluding a photo initiator (C), an additive agent, a solvent, and a filler unless otherwise noted, and the term "100 parts by mass of resin solid content" refers to the total of components in a resin composition excluding a photo initiator (C), an additive agent, a solvent, and a filler being 100 parts by mass.

[Resin Composition]

A resin composition of the present embodiment contains: a maleimide compound (A) having a transmittance of 5% or more at a wavelength of 405 nm (h-line); at least one carboxylic acid containing compound (B) selected from a compound represented by the above formula (1), a compound represented by the above formula (2), a compound represented by the above formula (3), and a compound represented by the above formula (4); and a photo initiator (C) having an absorbance of 0.1 or more at a wavelength of 405 nm (h-line). Hereinafter, each of these components will be described.

<Maleimide Compound (A) Having Transmittance of 5% or More at Wavelength of 405 nm (h-Line)>

The maleimide compound (A) according to the present embodiment (also referred to as the "component (A)") has a transmittance of 5% or more at a wavelength of 405 nm (h-line).

Normally, since maleimide compounds have poor light transmissivity, when the resin composition contains a maleimide compound, light does not sufficiently reach the photo initiator dispersed in the resin composition, and the photo initiator has difficulty in generating radicals. Therefore, in general, the photo radical reaction of maleimide compounds is difficult to proceed, and even if radical polymerization or dimerization reaction of single maleimide proceeds, its reactivity is very low. However, the maleimide compound (A) according to the present embodiment exhibits very excellent light transmissivity, with a transmittance of 5% or more, when a chloroform solution containing the maleimide compound (A) at 1% by mass is prepared and the light transmittance of this chloroform solution is measured using a ray of light with a wavelength of 405 nm (h-line). Therefore, the light sufficiently reaches the photo initiator and the photo radical reaction of the maleimide occurs efficiently, and even if the carboxylic acid containing compound (B), which will be described later, is contained, the maleimide compound (A) according to the present embodiment can be photo-cured. The light transmittance is preferably 8% or more, and more preferably 10% or more, because a resin composition that has more excellent photocurability can be obtained. Note that the upper limit is, for example, 99.9% or less.

Even if a maleimide compound having light transmissivity is used, the polymerization does not proceed unless the photo initiator absorbs the light with a wavelength of 405 nm (h-line) and generates radicals. Normally, photo initiators tend to have lower absorbance when rays of light with longer wavelengths are used. In the case of using an active energy ray (ray of light) including a wavelength of 405 nm (h-line), since the light of this wavelength has a relatively long wavelength, normal photo initiators do not absorb it. Unless a photo initiator that can suitably absorb this light and generate radicals is used, the polymerization does not proceed. However, the photo initiator (C), which will be mentioned later, exhibits very excellent absorption of the light with a wavelength of 405 nm (h-line), with an absorbance of 0.1 or more at a wavelength of 405 nm (h-line). Therefore, since the photo initiator (C) can suitably absorb the light with a wavelength of 405 nm (h-line) and generate radicals, the maleimide compound (A) can be efficiently photo-cured.

Furthermore, maleimide compounds are normally not reactive with alkaline developing solutions, making it difficult to obtain alkaline developability. However, in the present embodiment, by containing the maleimide compound (A), the carboxylic acid containing compound (B), and the photo initiator (C), it is possible to obtain a resin composition that has very excellent alkaline developability while having excellent photocurability. The reason for this is not certain, but the present inventors estimate it as follows. That is, when an alkaline developing solution flows into the unexposed portion during the development step, the alkaline component in the alkaline developing solution and the carboxy group in the carboxylic acid containing compound (B) can suitably form a salt, which improves water solubility. Therefore, the resin composition is estimated to have excellent alkaline developability.

Since the maleimide compound (A) has excellent light transmissivity as described above, even when the light with a wavelength of 405 nm is used, the light sufficiently reaches the photo initiator and the radical reaction using the radicals generated from the photo initiator proceeds, enabling photocuring even in a composition in which a large amount of the maleimide compound (A) is compounded. In addition, the resin composition according to the present embodiment is very excellent in alkaline developability. Hence, printed wiring boards having a highly dense and highly detailed wiring formation (pattern) can be suitably produced, using the active energy ray including a wavelength of 405 nm (h-line) and using the direct imaging method. And, since a cured product containing and obtained from the resin composition of the present embodiment has excellent heat resistance, insulation reliability, and thermal stability, according to the present embodiment, it is possible to suitably form protective films and insulation layers in multilayer printed wiring boards and semiconductor devices.

The maleimide compound (A) has a mass average molecular weight of preferably 100 to 20,000, and more preferably 150 to 10,000, from the standpoint that a suitable viscosity can be obtained and an increase in the viscosity of the varnish can be suppressed. Note that, in the present embodiment, the term "mass average molecular weight" refers to the mass average molecular weight in terms of polystyrene standard, as determined by the gel permeation chromatography (GPC) method.

The maleimide compound (A) is preferably a bismaleimide compound from the viewpoint of the number of crosslinking points. Examples of such a bismaleimide compound include, for example, a maleimide compound represented by the following formula (10), a maleimide compound represented by the following formula (11), a maleimide compound represented by the following formula (12) such as a maleimide compound represented by the following formula (18), a maleimide compound represented by the following formula (13), a maleimide compound represented by the following formula (14), a maleimide compound represented by the following formula (15), 1,6-bismaleimido-(2,2,4-trimethyl)hexane (a maleimide compound represented by the following formula (16)), a maleimide compound represented by the following formula (17), and fluorescein-5-maleimide.

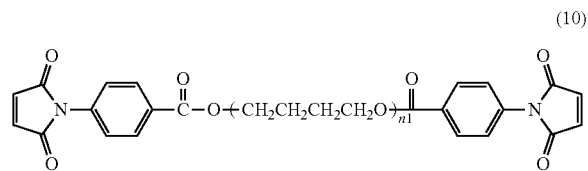
(10)

In the formula (10), $n_1$ (average) is 1 or more, preferably 1 to 21, and from the viewpoint of exhibiting excellent photocurability, more preferably 1 to 16.

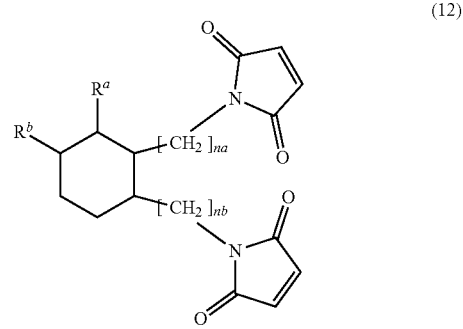
(12)

In the formula (12), $R^a$ represents a linear or branched alkyl group having 1 to 16 carbon atoms, or a linear or branched alkenyl group having 2 to 16 carbon atoms. $R^a$ is preferably a linear or branched alkyl group, and more preferably a linear alkyl group because excellent photocurability is exhibited.

The number of carbon atoms in the alkyl group is more preferably 4 to 12 since excellent photocurability is exhibited.

The number of carbon atoms in the alkenyl group is more preferably 4 to 12 since excellent photocurability is exhibited.

Examples of the alkyl group include, for example, a methyl group, an ethyl group, a n-propyl group, an isopropyl group, a n-butyl group, an isobutyl group, a sec-butyl group, a t-butyl group, a n-pentyl group, a 2-pentyl group, a tert-pentyl group, a neopentyl group, a 2-methylpentyl group, a 3-methylpentyl group, a 4-methylpentyl group, a 2-methylbutyl group, a 3-methylbutyl group, a 2,2-dimethylpropyl group, a n-hexyl group, a 3-hexyl group, a n-heptyl group, a n-octyl group, a n-ethylhexyl group, a n-nonyl group, a n-decyl group, and a 2-methylpentan-3-yl group. Among the above, since excellent photocurability is exhibited, a n-heptyl group, a n-octyl group, and a n-nonyl group are preferable, and a n-octyl group is more preferable.

Examples of the alkenyl group include, for example, a vinyl group, a (meth)allyl group, an isopropenyl group, a 1-propenyl group, a 2-butenyl group, a 3-butenyl group, a

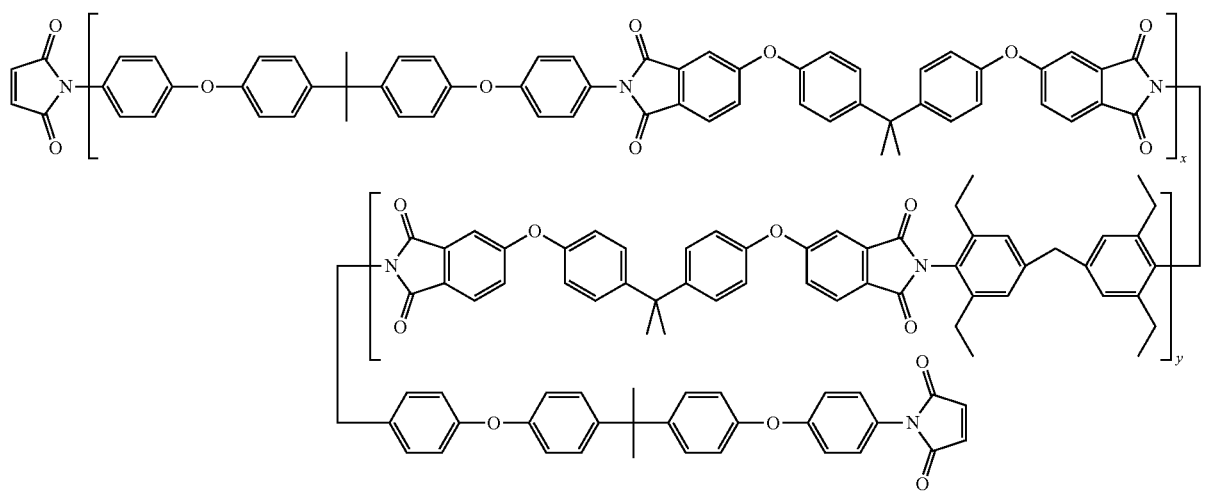
(11)

In the formula (11), the value of x is an integer of 10 to 35.

In the formula (11), the value of y is an integer of 10 to 35.

1,3-butanedienyl group, 2-methyl-2-propenyl, a 2-pentenyl group, a 3-pentenyl group, a 4-pentenyl group, a 2-hexenyl group, a 3-hexenyl group, a 4-hexenyl group, a 5-hexenyl group, a 2-heptenyl group, a 3-heptenyl group, a 4-heptenyl group, a 5-heptenyl group, a 6-heptenyl group, a 2-octenyl group, a 3-octenyl group, 4-octenyl group, a 5-octenyl group, a 6-octenyl group, 7-octenyl, a 2-nonenyl group, a 3-nonenyl group, a 4-nonenyl group, a 5-nonenyl group, a 6-nonenyl group, a 7-nonenyl group, a 8-nonenyl group, a 2-decenyl group, a 3-decenyl group, a 4-decenyl group, a 5-decenyl group, a 6-decenyl group, a 7-decenyl group, a 8-decenyl group, a 9-decenyl group, a 2-dodecenyl group, a 3-dodecenyl group, a 4-dodecenyl group, a 5-dodecenyl group, a 6-dodecenyl group, a 7-dodecenyl group, a 8-dodecenyl group, a 9-dodecenyl group, a 10-dodecenyl group, a tetradecenyl group, a hexadecenyl group, an octadecenyl group, an eicosenyl group, an octadecadienyl group, a 9,12,15-octadecatrienyl group, a 9,11,13-octadecatrienyl group, and crotyl. Among the above, since excellent photocurability is exhibited, a 2-heptenyl group, a 2-octenyl group, and a 2-nonenyl group are preferable, and a 2-octenyl group is more preferable.

In the formula (12), $R^b$ represents a linear or branched alkyl group having 1 to 16 carbon atoms, or a linear or branched alkenyl group having 2 to 16 carbon atoms. $R^b$ is preferably a linear or branched alkyl group, and more preferably a linear alkyl group because excellent photocurability is exhibited.

The number of carbon atoms in the alkyl group is more preferably 4 to 12 since excellent photocurability is exhibited.

The number of carbon atoms in the alkenyl group is more preferably 4 to 12 since excellent photocurability is exhibited.

As specific examples of the alkyl group, the alkyl groups in $R^a$ described above can be referred to. Among them, since excellent photocurability is exhibited, a n-heptyl group, a n-octyl group, and a n-nonyl group are preferable, and a n-octyl group is more preferable.

As specific examples of the alkenyl group, the alkenyl groups in $R^a$ described above can be referred to. Among them, since excellent photocurability is exhibited, a 2-heptenyl group, a 2-octenyl group, and a 2-nonenyl group are preferable, and a 2-octenyl group is more preferable.

In the formula (12), the value of $n_a$ is an integer of 1 or more, preferably an integer of 2 to 16, and from the viewpoint of exhibiting excellent photocurability, more preferably an integer of 3 to 14.

In the formula (12), the value of $n_b$ is an integer of 1 or more, preferably an integer of 2 to 16, and from the viewpoint of exhibiting excellent photocurability, more preferably an integer of 3 to 14.

The values of $n_a$ and $n_b$ may be the same, or may be different.

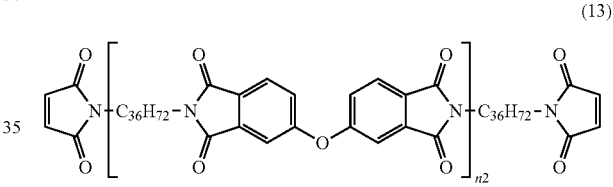

(13)

In the formula (13), $n_2$ (average) is 0.5 or more, preferably 0.8 to 10, and from the viewpoint of exhibiting excellent photocurability, more preferably 1 to 8.

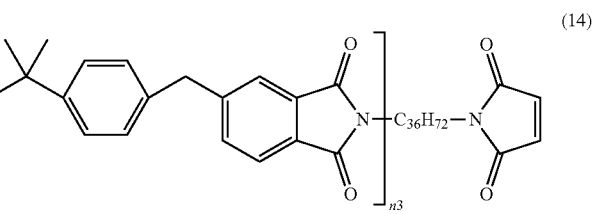

(14)

In the formula (14), $n_3$ represents an integer of 1 or more, and preferably represents an integer of 1 to 10.

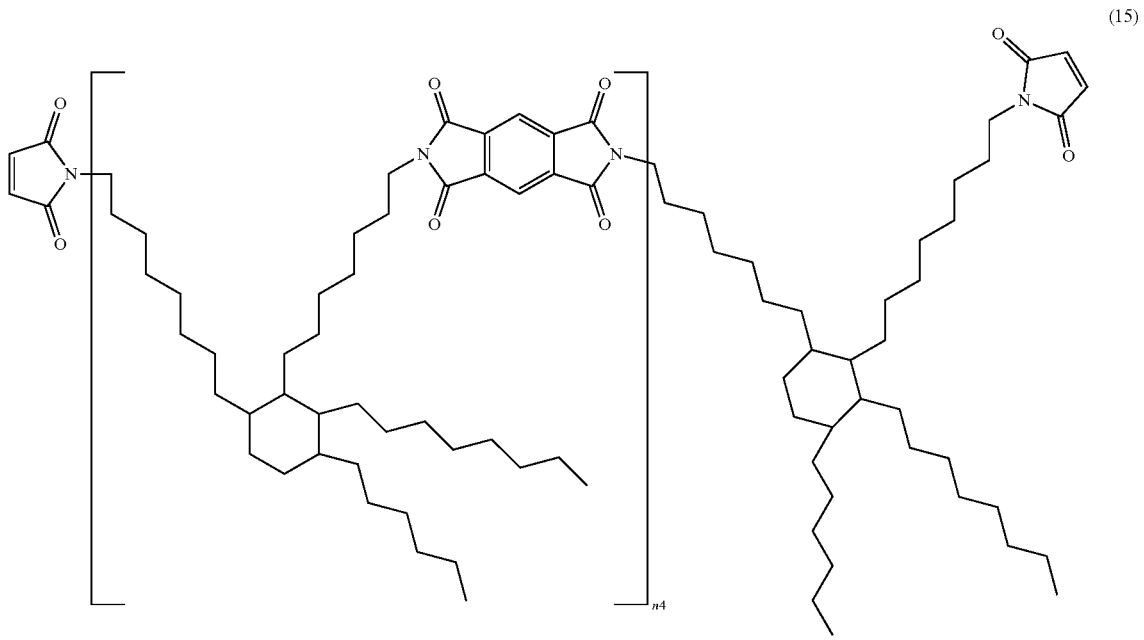

In the formula (15), $n_4$ represents an integer of 1 or more, and preferably represents an integer of 1 to 10.

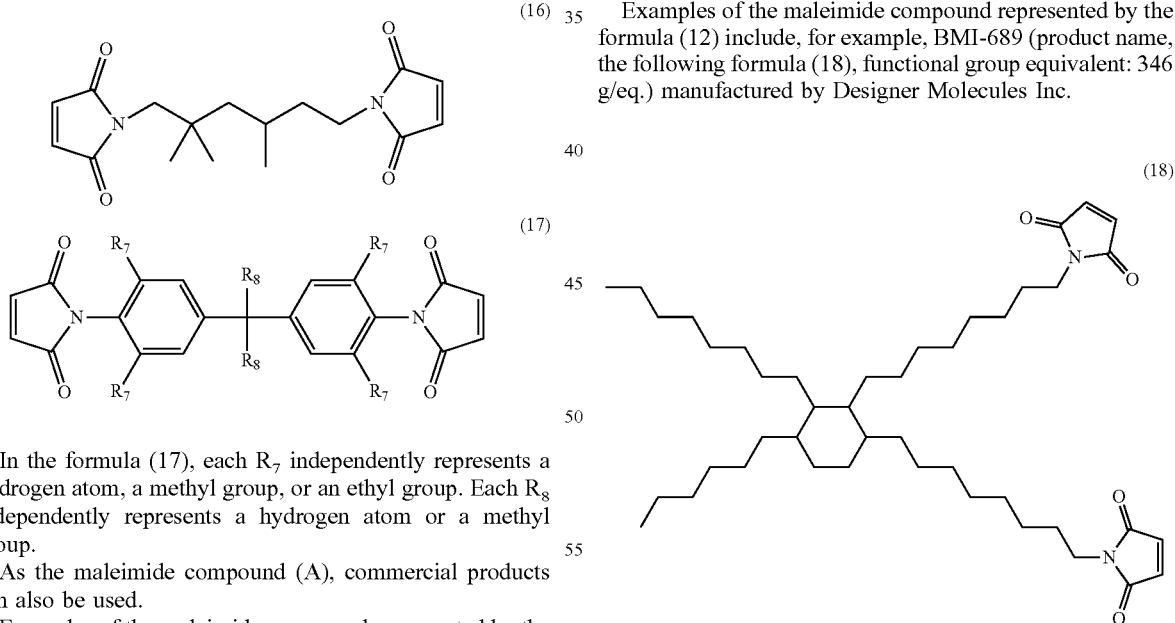

In the formula (17), each $R_7$ independently represents a hydrogen atom, a methyl group, or an ethyl group. Each $R_8$ independently represents a hydrogen atom or a methyl group.

As the maleimide compound (A), commercial products can also be used.

Examples of the maleimide compound represented by the formula (10) include, for example, BMI-1000P (product name, $n_1$=13.6 (average) in the formula (10)) manufactured by K-I Chemical Industry Co., LTD., BMI-650P (product name, $n_1$=8.8 (average) in the formula (10)) manufactured by K-I Chemical Industry Co., LTD., BMI-250P (product name, $n_1$=3 to 8 (average) in the formula (10)) manufactured by K-I Chemical Industry Co., LTD., and CUA-4 (product name, $n_1$=1 in the formula (10)) manufactured by K-I Chemical Industry Co., LTD.

Examples of the maleimide compound represented by the formula (11) include, for example, BMI-6100 (product name, x=18 and y=18 in the formula (11)) manufactured by Designer Molecules Inc.

Examples of the maleimide compound represented by the formula (12) include, for example, BMI-689 (product name, the following formula (18), functional group equivalent: 346 g/eq.) manufactured by Designer Molecules Inc.

Examples of the maleimide compound represented by the formula (13) include, for example, BMI-1500 (product name, $n_2$=1.3 in the formula (13), functional group equivalent: 754 g/eq.) manufactured by Designer Molecules Inc.

As the maleimide compound represented by the formula (14), commercial products can also be used, and examples thereof include, for example, BMI-1700 (product name) manufactured by Designer Molecules Inc. (DMI).

As the maleimide compound represented by the formula (15), commercial products can also be used, and examples thereof include, for example, BMI-3000 (product name) manufactured by Designer Molecules Inc. (DMI), BMI-5000 (product name) manufactured by Designer Molecules Inc. (DMI), and BMI-9000 (product name) manufactured by Designer Molecules Inc. (DMI).

As the maleimide compound represented by the formula (16), commercial products can also be used, and examples thereof include, for example, BMI-TMH manufactured by Daiwa Kasei Industry Co., LTD.

As the maleimide compound represented by the formula (17), commercial products can also be used, and examples thereof include, for example, BMI-70 (product name, bis-(3-ethyl-5-methyl-4-maleimidophenyl)methane) manufactured by K-I Chemical Industry Co., LTD.

The maleimide compound (A) may be used alone as one kind, or may be used as an arbitrary mixture of two or more kinds.

In the resin composition of the present embodiment, the content of the maleimide compound (A) is preferably 40 to 99 parts by mass, more preferably 50 to 97 parts by mass, and still more preferably 60 to 96 parts by mass based on 100 parts by mass of the total of the maleimide compound (A), the carboxylic acid containing compound (B), which will be mentioned later, and the photo initiator (C), which will be mentioned later, from the viewpoint that it becomes possible to obtain a cured product mainly composed of the maleimide compound and that the photocurability is improved.

<Carboxylic Acid Containing Compound (B)>

The carboxylic acid containing compound (B) according to the present embodiment (also referred to as the component (B)) is at least one selected from a compound represented by the following formula (1), a compound represented by the following formula (2), a compound represented by the following formula (3), and a compound represented by the following formula (4). The carboxylic acid containing compound (B) may be used alone as one kind, or may be used as an arbitrary mixture of two or more kinds.

In the present embodiment, a cured product can be obtained by photocuring the resin composition containing the carboxylic acid containing compound (B) together with the maleimide compound (A) and the photo initiator (C), using the active energy ray including a wavelength of 405 nm (h-line). Also, according to the present embodiment, it is possible to obtain the resin composition containing the carboxylic acid containing compound (B) in the unexposed portion.

In order to efficiently cause the photo radical reaction of the maleimide, it is preferable for the carboxylic acid containing compound (B) to have a transmittance of 5% or more when a solution containing 1% by mass of the carboxylic acid containing compound (B) in N-methylpyrrolidone is prepared and the transmittance of this N-methylpyrrolidone solution is measured using the ray of light with a wavelength of 405 nm (h-line). Since the carboxylic acid containing compound (B) has excellent light transmissivity, the light sufficiently reaches the photo initiator and the photo radical reaction of the maleimide occurs efficiently, and even if the carboxylic acid containing compound (B) is contained, the maleimide compound (A) according to the present embodiment can be photo-cured. The transmittance is preferably 8% or more, and more preferably 10% or more, because a resin composition that has more excellent photocurability can be obtained. Note that the upper limit is, for example, 99.9% or less.

In the present embodiment, it is preferable that the carboxylic acid containing compound (B) should include a carboxy group in an integer of 2 to 4 from the standpoint that more excellent alkaline developability can be obtained.

A compound represented by the following formula (1) is as follows.

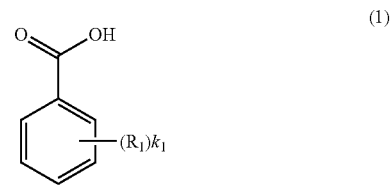

(1)

In the formula (1), each $R_1$ independently represents a hydrogen atom, a hydroxyl group, a carboxy group, an amino group, or an aminomethyl group. In addition, when the compound represented by the formula (1) has two or more carboxy groups, it may be an acid anhydride formed by linking the two or more carboxy groups to each other. In the formula (1), the upper limit of the number of carboxy groups is 6.

From the standpoint of alkaline developability, it is preferable that each $R_1$ should be independently a hydrogen atom, a hydroxyl group, a carboxy group, or an amino group, and it is more preferable that it should include a carboxy group from the standpoint that more excellent alkaline developability can be obtained. Note that benzoic acid tends to be inferior to other carboxylic acid containing compounds (B) in terms of alkaline developability.

Also, each $k_1$ independently represents an integer of 1 to 5.

It is preferable that the compound represented by the formula (1) should be a compound represented by the following formula (5) from the standpoint that more excellent alkaline developability can be obtained.

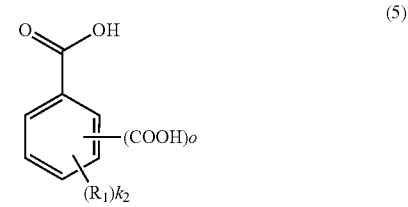

(5)

In the formula (5), each $R_1$ independently represents a hydrogen atom, a hydroxyl group, an amino group, or an aminomethyl group. From the standpoint of exhibiting more excellent alkaline developability, it is preferable that $R_1$ should be a hydrogen atom or a hydroxyl group, and it is more preferable that it should be a hydrogen atom.

Also, each $k_2$ independently represents an integer of 0 to 4.

The number of carboxy groups, o, represents an integer of $(5-k_2)$. From the standpoint of exhibiting more excellent alkaline developability, it is preferable that the number of carboxy groups, o, should be an integer of 1 to 3. In this case, the number of $R_1$, $k_2$, is an integer of 2 to 4, which is an integer of (5-o).

The compound represented by the formula (5) may include two or more carboxy groups and may be an acid anhydride formed by linking the two or more carboxy groups to each other.

Examples of the compound represented by the formula (1) include, for example, 4-aminobenzoic acid, salicylic acid, phthalic acid, trimellitic acid, pyromellitic acid, 4-aminomethylbenzoic acid, and anhydrides thereof. Examples of these anhydrides include, for example, phthalic anhydride, trimellitic anhydride, and pyromellitic anhydride. From the standpoint that more excellent alkaline developability can be obtained, it is preferable that the compound represented by the formula (1) should be phthalic acid, trimellitic acid, pyromellitic acid, and anhydrides thereof.

A compound represented by the following formula (2) is as follows.

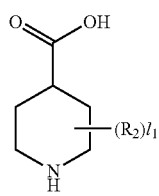

(2)

In the formula (2), each $R_2$ independently represents a hydrogen atom, a hydroxyl group, a carboxy group, a carboxymethyl group, an amino group, or an aminomethyl group. In addition, when the compound represented by the formula (2) has two or more carboxy groups, it may be an acid anhydride formed by linking the two or more carboxy groups to each other. In the formula (2), the upper limit of the number of carboxy groups is 10. When the compound represented by the formula (2) has a carboxymethyl group, it may be an acid anhydride formed by linking a carboxymethyl group and a carboxy group to each other.

From the standpoint of alkaline developability, it is preferable that each $R_2$ should be independently a hydrogen atom, a hydroxyl group, a carboxy group, or an amino group, and it is more preferable that it should include a carboxy group from the standpoint that more excellent alkaline developability can be obtained. Also, each $l_1$ independently represents an integer of 1 to 9.

Note that piperidinecarboxylic acid tends to be inferior to other carboxylic acid containing compounds (B) in terms of alkaline developability.

When a carboxy group is included as $R_2$, it is preferable that the number of carboxy groups, $l_1$, should be 1 to 3 from the standpoint of alkaline developability. As for $R_2$ other than the carboxy group, it is preferable that each of them should be independently a hydrogen atom or a hydroxyl group, and it is more preferable that each of them should be a hydrogen atom. When the compound represented by the formula (2) includes one to three carboxy groups, the number of $R_2$ other than the carboxy group is 7 to 9.

Examples of the compound represented by the formula (2) include, for example, piperidinecarboxylic acid, 1,2-piperidinedicarboxylic acid, and piperidinedicarboxylic anhydride.

A compound represented by the following formula (3) is as follows.

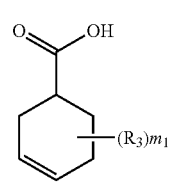

(3)

In the formula (3), each $R_3$ independently represents a hydrogen atom, a hydroxyl group, a carboxy group, a carboxymethyl group, an amino group, or an aminomethyl group. In addition, when the compound represented by the formula (3) has two or more carboxy groups, it may be an acid anhydride formed by linking the two or more carboxy groups to each other. In the formula (3), the upper limit of the number of carboxy groups is 10. When the compound represented by the formula (3) has a carboxymethyl group, it may be an acid anhydride formed by linking a carboxymethyl group and a carboxy group to each other.

From the standpoint of alkaline developability, it is preferable that each $R_3$ should be independently a hydrogen atom, a hydroxyl group, a carboxy group, or an amino group, and it is more preferable that it should include a carboxy group from the standpoint that more excellent alkaline developability can be obtained.

Also, each $m_1$ independently represents an integer of 1 to 9.

It is preferable that the compound represented by the formula (3) should be a compound represented by the following formula (6) from the standpoint that more excellent alkaline developability can be obtained.

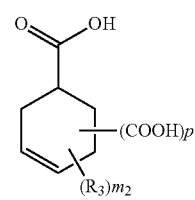

(6)

In the formula (6), each $R_3$ independently represents a hydrogen atom, a hydroxyl group, a carboxymethyl group, an amino group, or an aminomethyl group. From the standpoint of exhibiting more excellent alkaline developability, it is preferable that $R_3$ should be a hydrogen atom or a hydroxyl group, and it is more preferable that it should be a hydrogen atom.

Also, each $m_2$ independently represents an integer of 0 to 8.

The number of carboxy groups, p, represents an integer of $(9-m_2)$. From the standpoint of exhibiting more excellent alkaline developability, it is preferable that the number of carboxy groups, p, should be an integer of 1 to 3. In this case, the number of $R_3$, $m_2$, is an integer of 6 to 8, which is an integer of (9-p). The compound represented by the formula (6) may include two or more carboxy groups and may be an acid anhydride formed by linking the two or more carboxy groups to each other. Also, when the compound represented by the formula (6) has a carboxymethyl group, it may be an acid anhydride formed by linking a carboxymethyl group and a carboxy group to each other.

Examples of the compound represented by the formula (3) include, for example, 3-cyclohexene-1-carboxylic acid, cis- 4-cyclohexene-1,2-dicarboxylic acid, and cis-4-cyclohexene-1,2-dicarboxylic anhydride. It is preferable that the compound represented by the formula (3) should be cis-4-cyclohexene-1,2-dicarboxylic acid or cis-4-cyclohexene-1,2-dicarboxylic anhydride from the standpoint that more excellent alkaline developability can be obtained.

A compound represented by the following formula (4) is as follows.

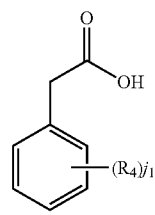
(4)

In the formula (4), each $R_4$ independently represents a hydrogen atom, a hydroxyl group, a carboxy group, a carboxymethyl group, an amino group, or an aminomethyl group. Also, when the compound represented by the formula (4) has one or more carboxy groups, it may be an acid anhydride formed by linking a carboxymethyl group and a carboxy group to each other. In addition, when the formula (4) has two or more carboxy groups, the formula (4) may be an acid anhydride formed by linking the two or more carboxy groups to each other. In the formula (4), the upper limit of the number of carboxy groups is 5. When the formula (4) has two or more carboxymethyl groups, the formula (4) may be an acid anhydride formed by linking the two or more carboxymethyl groups to each other. In the formula (4), the upper limit of the number of carboxymethyl groups is 6.

From the standpoint of alkaline developability, it is preferable that each $R_4$ should be independently a hydrogen atom, a hydroxyl group, a carboxy group, or an amino group, and it is more preferable that it should include a carboxy group from the standpoint that more excellent alkaline developability can be obtained.

Also, each $j_1$ independently represents an integer of 1 to 5.

It is preferable that the compound represented by the formula (4) should be a compound represented by the following formula (7) from the standpoint that more excellent alkaline developability can be obtained.

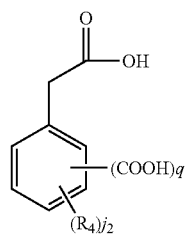
(7)

In the formula (7), each $R_4$ independently represents a hydrogen atom, a hydroxyl group, a carboxymethyl group, an amino group, or an aminomethyl group. From the standpoint of exhibiting more excellent alkaline developability, it is preferable that $R_4$ should be a hydrogen atom or a hydroxyl group, and it is more preferable that it should be a hydrogen atom.

Also, each $j_2$ independently represents an integer of 0 to 4.

The number of carboxy groups, q, represents an integer of $(5-j_2)$. From the standpoint of exhibiting more excellent alkaline developability, it is preferable that the number of carboxy groups, q, should be an integer of 1 to 3. In this case, the number of $R_4$, $j_2$, is an integer of 2 to 4, which is an integer of $(5-q)$.

The formula (7) may be an acid anhydride formed by linking a carboxymethyl group and a carboxy group to each other. When the compound represented by the formula (7) has two or more carboxy groups, it may be an acid anhydride formed by linking the two or more carboxy groups to each other. In the formula (7), the upper limit of the number of carboxy groups is 5. When the compound represented by the formula (7) has two or more carboxymethyl groups, it may be an acid anhydride formed by linking the two or more carboxymethyl groups to each other. In the formula (7), the upper limit of the number of carboxymethyl groups is 5.

Examples of the compound represented by the formula (4) include, for example, phenyleneacetic acid, 1,2-phenylenediacetic acid, 1,3-phenylenediacetic acid, 1,4-phenylenediacetic acid, and anhydrides thereof. Examples of these anhydrides include, for example, 1,2-phenylenediacetic anhydride. It is preferable that the compound represented by the formula (4) should be 1,2-phenylenediacetic acid from the standpoint that more excellent alkaline developability can be obtained.

In the resin composition of the present embodiment, the content of the carboxylic acid containing compound (B) according to the present embodiment is preferably 0.01 to 60 parts by mass, more preferably 0.1 to 50 parts by mass, and still more preferably 1 to 40 parts by mass based on 100 parts by mass of the maleimide compound (A) from the standpoint of alkaline developability.

In the resin composition of the present embodiment, the content of the carboxylic acid containing compound (B) is preferably 0.01 to 30 parts by mass, more preferably 0.01 to 25 parts by mass, and still more preferably 0.01 to 20 parts by mass based on 100 parts by mass of the total of the maleimide compound (A), the carboxylic acid containing compound (B), and the photo initiator (C), which will be mentioned later, from the viewpoint that it becomes possible to obtain a cured product that is more excellent in alkaline developability.

<Photo Initiator (C)>

The photo initiator (C) used in the present embodiment (also referred to as the component (C)) is not particularly limited as long as it has an absorbance of 0.1 or more at a wavelength of 405 nm (h-line), and those publicly known in the field generally used in photocurable resin compositions can be used. In the present embodiment, a cured product can be obtained by photocuring the resin composition containing the photo initiator (C) together with the maleimide compound (A) and the carboxylic acid containing compound (B), using the active energy ray including a wavelength of 405 nm (h-line). The photo initiator (C) may be used alone as one kind, or may be used as an arbitrary mixture of two or more kinds.

In the present embodiment, when the absorbance of a chloroform solution containing 1% by mass of the photo initiator (C) is measured using the ray of light with a wavelength of 405 nm (h-line), the absorbance is 0.1 or more. As described above, the photo initiator (C) exhibits very excellent light absorption even when using a ray of light with a long wavelength. It is preferable that the absorbance should be 0.2 or more because a resin composition that has more excellent photocurability can be obtained. Note that the upper limit is, for example, 99.9 or less.

As the photo initiator (C), a compound represented by the following formula (8) is preferable.

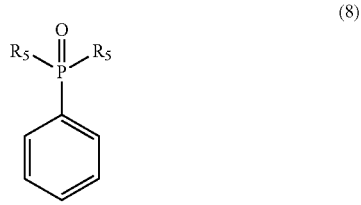

(8)

In the formula (8), each $R_5$ independently represents a substituent represented by the following formula (9) or a phenyl group.

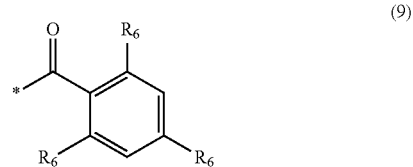

(9)

In the formula (9), -* represents a bonding hand and each $R_6$ independently represents a hydrogen atom or a methyl group.

As for the compound represented by the above formula (8), when a chloroform solution containing this compound at 1% by mass is prepared and the absorbance of this chloroform solution is measured using the ray of light with a wavelength of 405 nm (h-line), the absorbance is 0.1 or more, exhibiting very excellent absorption of the light with a wavelength of 405 nm (h-line). Therefore, this compound suitably generates radicals in response to the light with a wavelength of 405 nm (h-line).

It is preferable that the absorbance should be 0.2 or more. The upper limit value is, for example, 2.0 or less.

In the formula (8), each $R_5$ independently represents a substituent represented by the formula (9) or a phenyl group. It is preferable that one or more among $R_5$ should be substituents represented by the formula (9).

In the formula (9), each $R_6$ independently represent a hydrogen atom or a methyl group. It is preferable that one or more among $R_6$ should be methyl groups, and it is more preferable that all should be methyl groups.

Examples of the compound represented by the above formula (8) include, for example, an acylphosphine oxide such as 2,4,6-trimethylbenzoyl-diphenyl-phosphine oxide, bis(2,4,6-trimethylbenzoyl)-phenylphosphine oxide, and ethoxyphenyl(2,4,6-trimethylbenzoyl)-phosphine oxide. These compounds may be used alone as one kind, or may be used as an arbitrary mixture of two or more kinds.

Acylphosphine oxides exhibit very excellent absorption of the active energy ray including a wavelength of 405 nm (h-line) and can suitably radical polymerize the maleimide compound (A) having a transmittance of 5% or more at a wavelength of 405 nm (h-line). Therefore, by using acylphosphine oxides, it is possible to suitably obtain a resin composition and resin sheet that have excellent photocurability and alkaline developability, especially when used in multilayer printed wiring boards. In addition, it becomes possible to suitably produce a multilayer printed wiring board and a semiconductor device using them.

In the resin composition of the present embodiment, the content of the photo initiator (C) is preferably 0.01 to 20 parts by mass, more preferably 0.1 to 15 parts by mass, and still more preferably 1 to 10 parts by mass based on 100 parts by mass of the maleimide compound (A), from the viewpoint of sufficiently progressing the photocuring of the maleimide compound using the active energy ray including a wavelength of 405 nm (h-line) and sufficiently insolubilizing the exposed portion for alkaline developability.

In the resin composition of the present embodiment, the content of the photo initiator (C) is preferably 0.99 to 30 parts by mass, more preferably 2.99 to 25 parts by mass, and still more preferably 3.99 to 10 parts by mass based on 100 parts by mass of the total of the maleimide compound (A), the carboxylic acid containing compound (B), and the photo initiator (C), from the viewpoint of sufficiently progressing the photocuring of the maleimide compound using the active energy ray including a wavelength of 405 nm (h-line) and sufficiently insolubilizing the exposed portion for alkaline developability.

As the photo initiator (C), commercial products can also be used, and examples thereof include, for example, Omnirad (registered trademark) 819 (product name) manufactured by IGM Resins B.V., Omnirad (registered trademark) TPO G (product name) manufactured by IGM Resins B.V., and Omnirad (registered trademark) TPO L G (product name) manufactured by IGM Resins B.V.

<Maleimide Compound (D) Other than Maleimide Compound (A)>

In the present embodiment, a maleimide compound (D) (also referred to as a component (D)) other than the maleimide compound (A) of the present embodiment may be used as long as the resin composition of the present embodiment is light-sensitive and photo-cured when exposed with the active energy ray including a wavelength of 405 nm (h-line). As described above, since the maleimide compound (A) has very excellent light transmissivity, even when the maleimide compound (D) is used, the light sufficiently reaches the photo initiator and the photo radical reaction of the maleimide occurs efficiently. Due to the above, even when the active energy ray including a wavelength of 405 nm is used, the light sufficiently reaches the photo initiator and the radical reaction using the radicals generated from the photo initiator proceeds, enabling photocuring even in a resin composition in which the maleimide compound (D) is compounded. The maleimide compound (D) will be described below.

The maleimide compound (D) used in the present embodiment is not particularly limited as long as it is a compound other than the maleimide compound (A) and has one or more maleimide groups in the molecule. Examples of the maleimide compound (D) include, for example, N-phenylmaleimide, N-cyclohexylmaleimide, N-hydroxyphenylmaleimide, N-anilinophenylmaleimide, N-carboxyphenylmaleimide, N-(4-carboxy-3-hydroxyphenyl)maleimide, 6-maleimidohexanoic acid, 4-maleimidobutyric acid, bis(4-maleimidophenyl)methane, 2,2-bis(4-(4-maleimidophenoxy)-phenyl)propane, 4,4-diphenylmethanebismaleimide, bis(3,5-dimethyl-4-maleimidophenyl)methane, bis(3-ethyl-5-methyl-4-maleimidophenyl)methane, bis(3,5-diethyl-4-maleimidophenyl)methane, phenylmethanemaleimide, o-phenylenebismaleimide, m-phenylenebismaleimide, p-phenylenebismaleimide, o-phenylenebiscitraconimide, m-phenylenebiscitraconimide, p-phenylenebiscitraconimide, 2,2-bis(4-(4-maleimidophenoxy)-phenyl)propane, 3,3-dimethyl-5,5-diethyl-4,4-diphenylmethanebismaleimide, 4-methyl-1,3-phenylenebismaleimide, 1,2-bis(maleimido)ethane, 1,4-bis(maleimido)butane, 1,5-bis(maleimido)pentane, 1,5-bis(maleimido)-2-methylpentane, 1,6-bis(maleimido)hexane, 1,6-bismaleimido-(2,2,4-trimethyl)hexane, 1,8-bismaleimido-3,6-dioxaoctane, 1,11-bismaleimido-3,6,9-trioxaundecane, 1,3-bis(maleimidomethyl)cyclohexane, 1,4-bis(maleimidomethyl)cyclohexane, 4,4-diphenyl ether bismaleimide, 4,4-diphenyl sulfone bismaleimide, 1,3-bis(3-maleimidophenoxy)benzene, 1,3-bis(4-maleimidophenoxy)benzene, 4,4-diphenylmethanebiscitraconimide, 2,2-bis[4-(4-citraconimidophenoxy)phenyl]propane, bis(3,5-dimethyl-4-citraconimidophenyl)methane, bis(3-ethyl-5-methyl-4-citraconimidophenyl)methane, bis(3,5-diethyl-4-citraconimidophenyl)methane, polyphenylmethanemaleimide, fluorescein-5-maleimide, a maleimide compound represented by the following formula (19) such as polyphenylmethanemaleimide, and a maleimide compound represented by the following formula (20), as well as a prepolymer of these maleimide compounds and a prepolymer of maleimide compounds and amine compounds.

As the maleimide compound represented by the following formula (19), commercial products can also be used, and examples thereof include, for example, BMI-2300 (product name) manufactured by Daiwa Kasei Industry Co., LTD. As the maleimide compound represented by the following formula (20), commercial products can also be used, and examples thereof include, for example, MIR-3000 (product name) manufactured by Nippon Kayaku Co., Ltd.

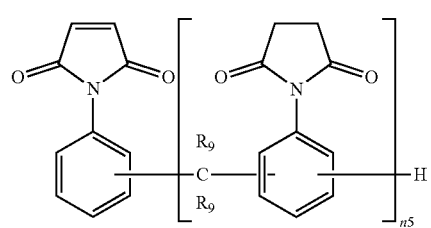

(19)

In the formula (19), each $R_9$ independently represents a hydrogen atom or a methyl group. $n_5$ represents an integer of 1 or more, preferably represents an integer of 1 to 10, and more preferably represents an integer of 1 to 5.

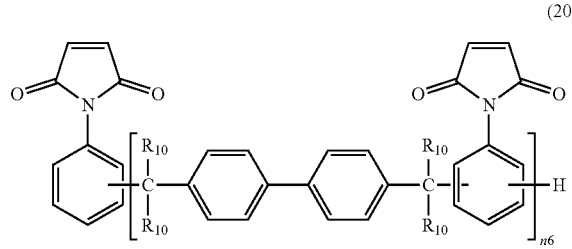

(20)

In the formula (20), each $R_{10}$ independently represents a hydrogen atom or a methyl group. $n_6$ represents an integer of 1 or more and preferably represents an integer of 1 to 5.

The maleimide compound (D) may be used alone as one kind, or may be used as an arbitrary mixture of two or more kinds.

In the resin composition of the present embodiment, the compounding ratio ((A):(D)) between the maleimide compound (A) and the maleimide compound (D) is preferably 1 to 99:99 to 1, more preferably 5 to 95:95 to 5, and still more preferably 10 to 90:90 to 10 on a mass basis, from the viewpoint that it becomes possible to obtain a cured product mainly composed of the maleimide compounds and that the photocurability is improved.

In the resin composition of the present embodiment, the total content of the maleimide compound (A) and the maleimide compound (D) is preferably 40 to 99 parts by mass, more preferably 50 to 97 parts by mass, and still more preferably 70 to 96 parts by mass based on 100 parts by mass of the total of the maleimide compound (A), the carboxylic acid containing compound (B), the photo initiator (C), and the maleimide compound (D), from the viewpoint that it becomes possible to obtain a cured product mainly composed of the maleimide compounds and that the photocurability is improved.

<Filler (E)>

In the present embodiment, as long as the effects of the present invention are achieved, a filler (E) (also referred to as a component (E)) may also be used in order to improve a variety of characteristics such as a coating property and heat resistance. The filler (E) is not particularly limited as long as it has an insulation property and does not inhibit transmissivity for the ray of light with a wavelength of 405 nm (h-line).

Examples of the filler (E) include, for example, silica (for example, natural silica, fused silica, amorphous silica, hollow silica, and the like), an aluminum compound (for example, boehmite, aluminum hydroxide, alumina, aluminum nitride, and the like), a boron compound (for example, boron nitride and the like), a magnesium compound (for example, magnesium oxide, magnesium hydroxide, and the like), a calcium compound (for example, calcium carbonate and the like), a molybdenum compound (for example, molybdenum oxide, zinc molybdate, and the like), a barium compound (for example, barium sulfate, barium silicate, and the like), talc (for example, natural talc, calcined talc, and the like), mica, glass (for example, short fibrous glass, spherical glass, fine powder glass, E glass, T glass, D glass, and the like), silicone powder, a fluororesin-based filler, a urethane resin-based filler, a (meth)acrylic resin-based filler, a polyethylene-based filler, a styrene-butadiene rubber, and a silicone rubber. The fillers (E) may be used alone as one kind, or may be used as an arbitrary mixture of two or more kinds.

Among the above, it is preferable that the filler (E) should be silica, boehmite, barium sulfate, silicone powder, a fluororesin-based filler, a urethane resin-based filler, a (meth)acrylic resin-based filler, a polyethylene-based filler, a styrene-butadiene rubber, or a silicone rubber.

These fillers (E) may be surface-treated with a silane coupling agent, which will be mentioned later, or the like.

From the viewpoint of improving the heat resistance of the cured product and also obtaining a good coating property, the filler (E) is preferably silica and is more preferably fused silica. Examples of the silica include, for example, SFP-130MC (product name) manufactured by Denka Company Limited, and SC2050-MB (product name), SC1050-MLE (product name), YA010C-MFN (product name), and YA050C-MJA (product name) manufactured by Admatechs Company Limited.

From the viewpoint of ultraviolet light transmissivity of the resin composition, the particle diameter of the filler (E) is normally 0.005 to 10 μm and is preferably 0.01 to 1.0 μm.

In the resin composition of the present embodiment, the content of the filler (E) is preferably 30 parts by mass or less, more preferably 20 parts by mass or less, and still more preferably 10 parts by mass or less based on 100 parts by mass of the resin solid content in the resin composition, from the viewpoint of making the ultraviolet light transmissivity of the resin composition and the heat resistance of the cured product good. When the filler (E) is contained, the lower limit value of its content is normally 1 part by mass or more based on 100 parts by mass of the resin solid content in the resin composition from the viewpoint of obtaining effects of improving a variety of characteristics such as a coating property and heat resistance.

<Silane Coupling Agent and Wetting and Dispersing Agent>

In the present embodiment, a silane coupling agent and/or a wetting and dispersing agent may also be used in order to improve the dispersibility of the filler, and the adhesive strength between the polymer and/or the resin and the filler.

The silane coupling agent is not particularly limited as long as it is a silane coupling agent generally used for surface treatment of inorganic matters.

Examples of the silane coupling agent include, for example, aminosilane-based silane coupling agents such as 3-aminopropyltrimethoxysilane, 3-aminopropyltriethoxysilane, 3-aminopropyldimethoxymethylsilane, 3-aminopropyldiethoxymethylsilane, N-(2-aminoethyl)-3-aminopropyltrimethoxysilane, N-(2-aminoethyl)-3-aminopropyltriethoxysilane, N-(2-aminoethyl)-3-aminopropyldimethoxymethylsilane, N-(2-aminoethyl)-3-aminopropyldiethoxymethylsilane, N-phenyl-3-aminopropyltrimethoxysilane, N-phenyl-3-aminopropyltriethoxysilane, [3-(6-aminohexylamino)propyl]trimethoxysilane, and [3-(N,N-dimethylamino)propyl]trimethoxysilane; epoxysilane-based silane coupling agents such as 3-glycidoxypropyltrimethoxysilane, 3-glycidoxypropyltriethoxysilane, 3-glycidoxypropyldimethoxymethylsilane, 3-glycidoxypropyldiethoxymethylsilane, 2-(3,4-epoxycyclohexyl)ethyltrimethoxysilane, and [8-(glycidyloxy)-n-octyl]trimethoxysilane; vinylsilane-based silane coupling agents such as vinyltris(2-methoxyethoxy)silane, vinyltrimethoxysilane, vinyltriethoxysilane, dimethoxymethylvinylsilane, diethoxymethylvinylsilane, trimethoxy(7-octen-1-yl)silane, and trimethoxy(4-vinylphenyl)silane; methacrylsilane-based silane coupling agents such as 3-methacryloxypropyltrimethoxysilane, 3-methacryloxypropyltriethoxysilane, 3-methacryloxypropyldimethoxymethylsilane, and 3-methacryloxypropyldiethoxymethylsilane; acrylsilane-based silane coupling agents such as 3-acryloxypropyltrimethoxysilane and 3-acryloxypropyltriethoxysilane; isocyanatesilane-based silane coupling agents such as 3-isocyanatopropyltrimethoxysilane and 3-isocyanatopropyltriethoxysilane; isocyanuratesilane-based silane coupling agents such as tris-(trimethoxysilylpropyl)isocyanurate; mercaptosilane-based silane coupling agents such as 3-mercaptopropyltrimethoxysilane and 3-mercaptopropyldimethoxymethylsilane; ureidosilane-based silane coupling agents such as 3-ureidopropyltriethoxysilane; styrylsilane-based silane coupling agents such as p-styryltrimethoxysilane; cationic silane-based silane coupling agents such as N-[2-(N-vinylbenzylamino)ethyl]-3-aminopropyltrimethoxysilane hydrochloride; acid anhydride-based silane coupling agents such as [3-(trimethoxysilyl)propyl]succinic anhydride; phenylsilane-based silane coupling agents such as phenyltrimethoxysilane, phenyltriethoxysilane, dimethoxymethylphenylsilane, diethoxymethylphenylsilane, and p-tolyltrimethoxysilane; and arylsilane-based silane coupling agents such as trimethoxy(1-naphthyl)silane. The silane coupling agents may be used alone as one kind, or may be used as an arbitrary mixture of two or more kinds.

In the resin composition of the present embodiment, the content of the silane coupling agent is normally 0.1 to 10 parts by mass based on 100 parts by mass of the resin composition.

The wetting and dispersing agent is not particularly limited as long as it is a dispersion stabilizer used for a paint. Examples of the wetting and dispersing agent include, for example, DISPERBYK (registered trademark)-110 (product name), 111 (product name), 118 (product name), 180 (product name), and 161 (product name), BYK (registered trademark)-W996 (product name), W9010 (product name), and W903 (product name) manufactured by BYK Japan KK. The wetting and dispersing agent may be used alone as one kind, or may be used as an arbitrary mixture of two or more kinds.

In the resin composition of the present embodiment, the content of the wetting and dispersing agent is normally 0.1 to 10 parts by mass based on 100 parts by mass of the resin composition.

<Cyanate Compound, Phenolic Resin, Oxetane Resin, Benzoxazine Compound, Epoxy Resin, and Additional Compound>

In the present embodiment, as long as the effects of the present invention are achieved, a variety of types of compounds and resins, such as a cyanate compound, a phenolic resin, an oxetane resin, a benzoxazine compound, an epoxy resin, and an additional compound, other than the maleimide compound (A), the carboxylic acid containing compound (B), the photo initiator (C), and the maleimide compound (D), may be used depending on the characteristics of the cured product, such as flame retardancy, heat resistance, and thermal expansion characteristics. For example, when heat resistance is required, mention may be made of a cyanate compound, a benzoxazine compound, a phenolic resin, and an oxetane resin.

These resins and compounds may be used alone as one kind, or may be used as an arbitrary mixture of two or more kinds.

<Cyanate Compound>

The cyanate compound is not particularly limited as long as it is a resin having in the molecule an aromatic moiety substituted by at least one cyanate group (cyanate group).

For example, mention may be made of those represented by the formula (21).

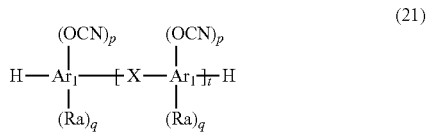

In the formula (21), $Ar_1$ represents a benzene ring, a naphthalene ring, or two benzene rings bonded to each other by a single bond. When there are a plurality of $Ar_1$, $Ar_1$ may be the same as or different from each other. Each Ra independently represents a hydrogen atom, an alkyl group having 1 to 6 carbon atoms, an alkenyl group having 2 to 6 carbon atoms, an aryl group having 6 to 12 carbon atoms, an alkoxyl group having 1 to 4 carbon atoms, or a group in which an alkyl group having 1 to 6 carbon atoms and an aryl group having 6 to 12 carbon atoms are bonded to each other. The aromatic ring for Ra may have a substituent, and any position can be selected for the substituents in $Ar_1$ and Ra.

p represents the number of cyanate groups bonded to $Ar_1$ and is each independently an integer of 1 to 3. q represents the number of Ra bonded to $Ar_1$ and is 4-p when $Ar_1$ is a benzene ring, 6-p when $Ar_1$ is a naphthalene ring, and 8-p when $Ar_1$ is two benzene rings bonded to each other by a single bond. t represents the average number of repetitions and is an integer of 0 to 50, and the cyanate compound may be a mixture of compounds having different t. X represents any of a single bond, a divalent organic group having 1 to 50 carbon atoms (a hydrogen atom may be replaced by a heteroatom), a divalent organic group having 1 to 10 nitrogen atoms (for example, —N—R—N— (wherein R represents an organic group)), a carbonyl group (—CO—), a carboxy group (—C(=O)O—), a carbonyl dioxide group (—OC(=O)O—), a sulfonyl group (—SO$_2$—), a divalent sulfur atom, and a divalent oxygen atom, and X is each independently as defined above when there are a plurality of X.

The alkyl group for Ra in the formula (21) may have either a linear or branched chain structure or a cyclic structure (for example, a cycloalkyl group).

In addition, a hydrogen atom in the alkyl group and the aryl group for Ra in the formula (21) may be replaced by a halogen atom such as a fluorine atom or a chlorine atom; an alkoxyl group such as a methoxy group or a phenoxy group; a cyano group, or the like.

Examples of the alkyl group include, for example, a methyl group, an ethyl group, a propyl group, an isopropyl group, a n-butyl group, an isobutyl group, a tert-butyl group, a n-pentyl group, a 1-ethylpropyl group, a 2,2-dimethylpropyl group, a cyclopentyl group, a hexyl group, a cyclohexyl group, and a trifluoromethyl group.

Examples of the alkenyl group include, for example, a vinyl group, a (meth)allyl group, an isopropenyl group, a 1-propenyl group, a 2-butenyl group, a 3-butenyl group, a 1,3-butanedienyl group, a 2-methyl-2-propenyl group, a 2-pentenyl group, and a 2-hexenyl group.

Examples of the aryl group include, for example, a phenyl group, a xylyl group, a mesityl group, a naphthyl group, a phenoxyphenyl group, an ethylphenyl group, an o-, m-, or p-fluorophenyl group, a dichlorophenyl group, a dicyanophenyl group, a trifluorophenyl group, a methoxyphenyl group, and an o-, m-, or p-tolyl group. Furthermore, examples of the alkoxyl group include, for example, a methoxy group, an ethoxy group, a propoxy group, an isopropoxy group, a n-butoxy group, an isobutoxy group, and a tert-butoxy group.

Examples of the divalent organic group having 1 to 50 carbon atoms for X in the formula (21) include, for example, a methylene group, an ethylene group, a trimethylene group, a cyclopentylene group, a cyclohexylene group, a trimethylcyclohexylene group, a biphenylylmethylene group, a dimethylmethylene-phenylene-dimethylmethylene group, a fluorenediyl group, and a phthalidediyl group. A hydrogen atom in the above divalent organic group may be replaced by a halogen atom such as a fluorine atom or a chlorine atom; an alkoxyl group such as a methoxy group or a phenoxy group; a cyano group, or the like.

Examples of the divalent organic group having 1 to 10 nitrogen atoms for X in the formula (21) include an imino group and a polyimide group.

In addition, examples of the organic group of X in the formula (21) include, for example, one having a structure represented by the following formula (22) or the following formula (23).

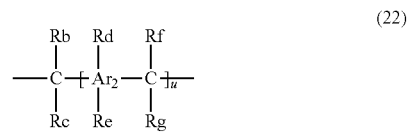

In the formula (22), $Ar_2$ represents a benzenediyl group, a naphthalenediyl group, or a biphenyldiyl group, and may be the same as or different from each other when u is an integer of 2 or more. Rb, Rc, Rf, and Rg each independently represent a hydrogen atom, an alkyl group having 1 to 6 carbon atoms, an aryl group having 6 to 12 carbon atoms, a trifluoromethyl group, or an aryl group having at least one phenolic hydroxy group. Rd and Re are each independently selected from any one of a hydrogen atom, an alkyl group having 1 to 6 carbon atoms, an aryl group having 6 to 12 carbon atoms, an alkoxyl group having 1 to 4 carbon atoms, or a hydroxy group. u represents an integer of 0 to 5.

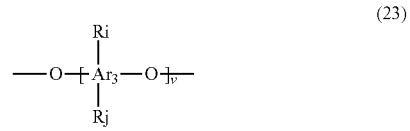

In the formula (23), $Ar_3$ represents a benzenediyl group, a naphthalenediyl group, or a biphenyldiyl group, and may be the same as or different from each other when v is an integer of 2 or more. Ri and Rj each independently represent a hydrogen atom, an alkyl group having 1 to 6 carbon atoms, an aryl group having 6 to 12 carbon atoms, a benzyl group, an alkoxyl group having 1 to 4 carbon atoms, a hydroxy group, a trifluoromethyl group, or an aryl group substituted by at least one cyanate group. v represents an integer of 0 to 5, and the cyanate compound may be a mixture of compounds having different v.

Furthermore, examples of X in the formula (21) include divalent groups represented by the following formulas.

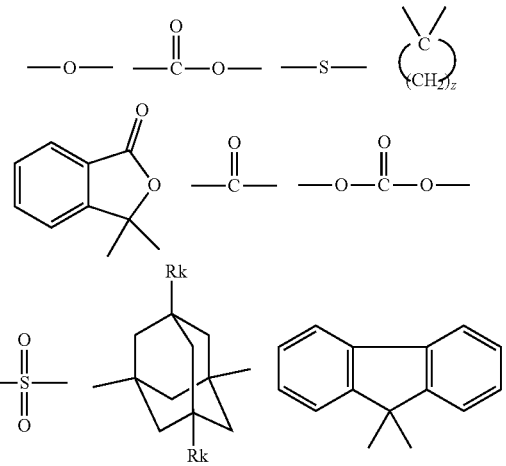

Here, in the above formula, z represents an integer of 4 to 7. Each Rk independently represents a hydrogen atom or an alkyl group having 1 to 6 carbon atoms.

Specific examples of $Ar_2$ in the formula (22) and $Ar_3$ in the formula (23) include a benzenediyl group to which two carbon atoms shown in the formula (22) or two oxygen atoms shown in the formula (23) are bonded at positions 1 and 4 or positions 1 and 3, a biphenyldiyl group to which the above two carbon atoms or two oxygen atoms are bonded at positions 4 and 4', positions 2 and 4', positions 2 and 2', positions 2 and 3', positions 3 and 3', or positions 3 and 4', and a naphthalenediyl group to which the above two carbon atoms or two oxygen atoms are bonded at positions 2 and 6, positions 1 and 5, positions 1 and 6, positions 1 and 8, positions 1 and 3, positions 1 and 4, or positions 2 and 7.

The alkyl group and the aryl group for Rb, Rc, Rd, Re, Rf, and Rg in the formula (22) and Ri and Rj in the formula (23) have the same meanings as those in the above formula (21).

Examples of the cyanate-substituted aromatic compound represented by the above formula (21) include, for example, cyanatebenzene, 1-cyanate-2-, 1-cyanate-3-, or 1-cyanate-4-methylbenzene, 1-cyanate-2-, 1-cyanate-3-, or 1-cyanate-4-methoxybenzene, 1-cyanate-2,3-, 1-cyanate-2,4-, 1-cyanate-2,5-, 1-cyanate-2,6-, 1-cyanate-3,4-, or 1-cyanate-3,5-dimethylbenzene, cyanateethylbenzene, cyanatebutylbenzene, cyanateoctylbenzene, cyanatenonylbenzene, 2-(4-cyanaphenyl)-2-phenylpropane (a cyanate of 4-α-cumylphenol), 1-cyanate-4-cyclohexylbenzene, 1-cyanate-4-vinylbenzene, 1-cyanate-2- or 1-cyanate-3-chlorobenzene, 1-cyanate-2,6-dichlorobenzene, 1-cyanate-2-methyl-3-chlorobenzene, cyanatenitrobenzene, 1-cyanate-4-nitro-2-ethylbenzene, 1-cyanate-2-methoxy-4-allylbenzene (a cyanate of eugenol), methyl(4-cyanatephenyl)sulfide, 1-cyanate-3-trifluoromethylbenzene, 4-cyanatebiphenyl, 1-cyanate-2- or 1-cyanate-4-acetylbenzene, 4-cyanatebenzaldehyde, methyl 4-cyanatebenzoate ester, phenyl 4-cyanatebenzoate ester, 1-cyanate-4-acetaminobenzene, 4-cyanatebenzophenone, 1-cyanate-2,6-di-tert-butylbenzene, 1,2-dicyanatebenzene, 1,3-dicyanatebenzene, 1,4-dicyanatebenzene, 1,4-dicyanate-2-tert-butylbenzene, 1,4-dicyanate-2,4-dimethylbenzene, 1,4-dicyanate-2,3,4-dimethylbenzene, 1,3-dicyanate-2,4,6-trimethylbenzene, 1,3-dicyanate-5-methylbenzene, 1-cyanate- or 2-cyanatenaphthalene, 1-cyanate-4-methoxynaphthalene, 2-cyanate-6-methoxynaphthalene, 2-cyanate-7-methoxynaphthalene, 2,2'-dicyanate-1,1'-binaphthyl, 1,3-, 1,4-, 1,5-, 1,6-, 1,7-, 2,3-, 2,6-, or 2,7-dicyanatenaphthalene, 2,2'- or 4,4'-dicyanatebiphenyl, 4,4'-dicyanateoctafluorobiphenyl, 2,4'- or 4,4'-dicyanatediphenylmethane, bis(4-cyanate-3,5-dimethylphenyl)methane, 1,1-bis(4-cyanatephenyl)ethane, 1,1-bis(4-cyanatephenyl)propane, 2,2-bis(4-cyanatephenyl)propane, 2,2-bis(4-cyanate-3-methylphenyl)propane, 2,2-bis(2-cyanate-5-biphenylyl)propane, 2,2-bis(4-cyanatephenyl)hexafluoropropane, 2,2-bis(4-cyanate-3,5-dimethylphenyl)propane, 1,1-bis(4-cyanatephenyl)butane, 1,1-bis(4-cyanatephenyl)isobutane, 1,1-bis(4-cyanatephenyl)pentane, 1,1-bis(4-cyanatephenyl)-3-methylbutane, 1,1-bis(4-cyanatephenyl)-2-methylbutane, 1,1-bis(4-cyanatephenyl)-2,2-dimethylpropane, 2,2-bis(4-cyanatephenyl)butane, 2,2-bis(4-cyanatephenyl)pentane, 2,2-bis(4-cyanatephenyl)hexane, 2,2-bis(4-cyanatephenyl)-3-methylbutane, 2,2-bis(4-cyanatephenyl)-4-methylpentane, 2,2-bis(4-cyanatephenyl)-3,3-dimethylbutane, 3,3-bis(4-cyanatephenyl)hexane, 3,3-bis(4-cyanatephenyl)heptane, 3,3-bis(4-cyanatephenyl)octane, 3,3-bis(4-cyanatephenyl)-2-methylpentane, 3,3-bis(4-cyanatephenyl)-2-methylhexane, 3,3-bis(4-cyanatephenyl)-2,2-dimethylpentane, 4,4-bis(4-cyanatephenyl)-3-methylheptane, 3,3-bis(4-cyanatephenyl)-2-methylheptane, 3,3-bis(4-cyanatephenyl)-2,2-dimethylhexane, 3,3-bis(4-cyanatephenyl)-2,4-dimethylhexane, 3,3-bis(4-cyanatephenyl)-2,2,4-trimethylpentane, 2,2-bis(4-cyanatephenyl)-1,1,1,3,3,3-hexafluoropropane, bis(4-cyanatephenyl)phenylmethane, 1,1-bis(4-cyanatephenyl)-1-phenylethane, bis(4-cyanatephenyl)biphenylmethane, 1,1-bis(4-cyanatephenyl)cyclopentane, 1,1-bis(4-cyanatephenyl)cyclohexane, 2,2-bis(4-cyanate-3-isopropylphenyl)propane, 1,1-bis(3-cyclohexyl-4-cyanatephenyl)cyclohexane, bis(4-cyanatephenyl) diphenylmethane, bis(4-cyanatephenyl)-2,2-dichloroethylene, 1,3-bis[2-(4-cyanatephenyl)-2-propyl]benzene, 1,4-bis[2-(4-cyanatephenyl)-2-propyl]benzene, 1,1-bis(4-cyanatephenyl)-3,3,5-trimethylcyclohexane, 4-[bis(4-cyanatephenyl)methyl]biphenyl, 4,4-dicyanatebenzophenone, 1,3-bis(4-cyanatephenyl)-2-propen-1-one, bis(4-cyanatephenyl) ether, bis(4-cyanatephenyl) sulfide, bis(4-cyanatephenyl) sulfone, 4-cyanatebenzoic acid-4-cyanatephenyl ester (4-cyanatephenyl-4-cyanatebenzoate), bis-(4-cyanatephenyl) carbonate, 1,3-bis(4-cyanatephenyl)adamantane, 1,3-bis(4-cyanatephenyl)-5,7-dimethyladamantane, 3,3-bis(4-cyanatephenyl)isobenzofuran-1(3H)-one (a cyanate of phenolphthalein), 3,3-bis(4-cyanate-3-methylphenyl)isobenzofuran-1(3H)-one (a cyanate of o-cresolphthalein), 9,9'-bis(4-cyanatephenyl)fluorene, 9,9-bis(4-cyanate-3-methylphenyl)fluorene, 9,9-bis(2-cyanate-5-biphenylyl)fluorene, tris(4-cyanatephenyl)methane, 1,1,1-tris(4-cyanatephenyl)ethane, 1,1,3-tris(4-cyanatephenyl)propane, α,α,α'-tris(4-cyanatephenyl)-1-ethyl-4-isopropylbenzene, 1,1,2,2-tetrakis(4-cyanatephenyl)ethane, tetrakis(4-cyanatephenyl)methane, 2,4,6-tris(N-methyl-4-cyanateanilino)-1,3,5-triazine, 2,4-bis(N-methyl-4-cyanateanilino)-6-(N-methylanilino)-1,3,5-triazine, bis(N-4-cyanate-2-methylphenyl)-4,4'-oxydiphthalimide, bis(N-3-cyanate-4-methylphenyl)-4,4'-oxydiphthalimide, bis(N-4-cyanatephenyl)-4,4'-oxydiphthalimide, bis(N-4-cyanate-2-methylphenyl)-4,4'-(hexafluoroisopropylidene) diphthalimide, tris(3,5-dimethyl-4-cyanatebenzyl)isocyanurate, 2-phenyl-3,3-bis(4-cyanatephenyl)phthalimidine, 2-(4-methylphenyl)-3,3-bis(4-cyanatephenyl)phthalimidine, 2-phenyl-3,3-bis(4-cyanate-3-methylphenyl)phthalimidine, 1-methyl-3,3-bis(4-cyanatephenyl)indolin-2-one, and 2-phenyl-3,3-bis(4-cyanatephenyl)indolin-2-one.

In addition, other specific examples of the cyanate compound represented by the above formula (21) include those obtained by cyanation of a phenolic resin such as a phenol novolac resin and a cresol novolac resin (those obtained by reacting phenol, an alkyl-substituted phenol or a halogen-substituted phenol with a formaldehyde compound such as formalin or paraformaldehyde in an acidic solution, using a publicly known method), a trisphenol novolac resin (those obtained by reacting hydroxybenzaldehyde with phenol in the presence of an acidic catalyst), a fluorene novolac resin (those obtained by reacting a fluorenone compound with a 9,9-bis(hydroxyaryl)fluorene in the presence of an acidic catalyst), a phenol aralkyl resin, a cresol aralkyl resin, a naphthol aralkyl resin, and a biphenyl aralkyl resin (those obtained by reacting a bishalogenomethyl compound as represented by $Ar_4$—$(CH_2Y)_2$ (wherein $Ar_4$ represents a phenyl group and Y represents a halogen atom. The same applies in this paragraph.) with a phenolic compound with an acidic catalyst or with no catalyst, those obtained by reacting a bis(alkoxymethyl) compound as represented by $Ar_4$—$(CH_2OR)_2$ (wherein R represents an alkyl group) with a phenolic compound in the presence of an acidic catalyst, or those obtained by reacting a bis(hydroxymethyl) compound as represented by $Ar_4$—$(CH_2OH)_2$ with a phenolic compound in the presence of an acidic catalyst, or those obtained by polycondensing an aromatic aldehyde compound, an aralkyl compound, and a phenolic compound, using a publicly known method), a phenol-modified xylene formaldehyde resin (those obtained by reacting a xylene formaldehyde resin with a phenolic compound in the presence of an acidic catalyst, using a publicly known method), a modified naphthalene formaldehyde resin (those obtained by reacting a naphthalene formaldehyde resin with a hydroxy-substituted aromatic compound in the presence of an acidic catalyst, using a publicly known method), a phenol-modified dicyclopentadiene resin, and a phenolic resin having a polynaphthylene ether structure (those obtained by subjecting a polyvalent hydroxynaphthalene compound having two or more phenolic hydroxy groups in one molecule to dehydration condensation in the presence of a basic catalyst, using a publicly known method) by a method similar to the above, and a prepolymer thereof.

The cyanate compounds may be used alone as one kind, or may be used as an arbitrary mixture of two or more kinds.

The method for producing these cyanate compounds is not particularly limited, and a publicly known method can be used. Examples of such a production method include acquisition or synthesis of a hydroxy group containing compound having a desired skeleton and cyanation of that compound by modifying the hydroxy group by a publicly known method. Examples of the approach for the cyanation of hydroxy groups include, for example, the approach described in Ian Hamerton, "Chemistry and Technology of Cyanate Ester Resins," Blackie Academic & Professional.

The cured product using these cyanate compounds has characteristics excellent in glass transition temperature, a low thermal expansion property, plating adhesiveness, and the like.

In the resin composition of the present embodiment, the content of the cyanate compound is preferably 0.01 to 40 parts by mass based on 100 parts by mass of the resin solid content in the resin composition.

<Phenolic Resin>

As the phenolic resin, those publicly known in general can be used as long as they are phenolic resins having two or more hydroxyl groups in one molecule. Examples thereof include, for example, a bisphenol A-based phenolic resin, a bisphenol E-based phenolic resin, a bisphenol F-based phenolic resin, a bisphenol S-based phenolic resin, a phenol novolac resin, a bisphenol A novolac-based phenolic resin, a glycidyl ester-based phenolic resin, an aralkyl novolac-based phenolic resin, a biphenyl aralkyl-based phenolic resin, a cresol novolac-based phenolic resin, a polyfunctional phenolic resin, a naphthol resin, a naphthol novolac resin, a polyfunctional naphthol resin, an anthracene-based phenolic resin, a naphthalene skeleton modified novolac-based phenolic resin, a phenol aralkyl-based phenolic resin, a naphthol aralkyl-based phenolic resin, a dicyclopentadiene-based phenolic resin, a biphenyl-based phenolic resin, an alicyclic phenolic resin, a polyol-based phenolic resin, a phosphorus containing phenolic resin, a polymerizable unsaturated hydrocarbon group containing phenolic resin, and a hydroxyl group containing silicone resin.

The phenolic resin may be used alone as one kind, or may be used as an arbitrary mixture of two or more kinds.

In the resin composition of the present embodiment, the content of the phenolic resin is preferably 0.01 to 40 parts by mass based on 100 parts by mass of the resin solid content in the resin composition.

<Oxetane Resin>

As the oxetane resin, those publicly known in general can be used. Examples thereof include, for example, oxetane, an alkyloxetane such as 2-methyloxetane, 2,2-dimethyloxetane, 3-methyloxetane, and 3,3-dimethyloxetane, 3-methyl-3-methoxymethyloxetane, 3,3-di(trifluoromethyl)perfluoxetane, 2-chloromethyloxetane, 3,3-bis(chloromethyl)oxetane, biphenyl-based oxetane, OXT-101 (manufactured by Toagosei Co., Ltd., product name), OXT-121 (manufactured by Toagosei Co., Ltd., product name), and OXT-221 (manufactured by Toagosei Co., Ltd., product name). The oxetane resin may be used alone as one kind, or may be used as an arbitrary mixture of two or more kinds.

The content of the oxetane resin is preferably 0.01 to 40 parts by mass based on 100 parts by mass of the resin solid content in the resin composition.

<Benzoxazine Compound>

As the benzoxazine compound, those publicly known in general can be used as long as they are compounds having two or more dihydrobenzoxazine rings in one molecule. Examples thereof include, for example, a bisphenol A-based benzoxazine BA-BXZ (manufactured by Konishi Chemical Ind. Co., Ltd., product name), a bisphenol F-based benzoxazine BF-BXZ (manufactured by Konishi Chemical Inc. Co., Ltd., product name), a bisphenol S-based benzoxazine BS-BXZ (manufactured by Konishi Chemical Ind. Co., Ltd., product name), and a phenolphthalein-based benzoxazine.

The benzoxazine compound may be used alone as one kind, or may be used as an arbitrary mixture of two or more kinds.

The content of the benzoxazine compound is preferably 0.01 to 40 parts by mass based on 100 parts by mass of the resin solid content in the resin composition.

<Epoxy Resin>

There is no particular limitation on the epoxy resin, and those publicly known in general can be used. Examples thereof include, for example, a bisphenol A-based epoxy resin, a bisphenol E-based epoxy resin, a bisphenol F-based epoxy resin, a bisphenol S-based epoxy resin, a bisphenol A novolac-based epoxy resin, a biphenyl-based epoxy resin, a phenol novolac-based epoxy resin, a cresol novolac-based epoxy resin, a xylene novolac-based epoxy resin, a polyfunctional phenol-based epoxy resin, a naphthalene-based epoxy resin, a naphthalene skeleton modified novolac-based epoxy resin, a naphthylene ether-based epoxy resin, a phenol aralkyl-based epoxy resin, an anthracene-based epoxy resin, a trifunctional phenol-based epoxy resin, a tetrafunctional phenol-based epoxy resin, triglycidyl isocyanurate, a glycidyl ester-based epoxy resin, an alicyclic epoxy resin, a dicyclopentadiene novolac-based epoxy resin, a biphenyl novolac-based epoxy resin, a phenol aralkyl novolac-based epoxy resin, a naphthol aralkyl novolac-based epoxy resin, an aralkyl novolac-based epoxy resin, a naphthol aralkyl-based epoxy resin, a dicyclopentadiene-based epoxy resin, a polyol-based epoxy resin, a phosphorus containing epoxy resin, a glycidyl amine, a compound obtained by epoxidizing a double bond of butadiene and the like, a compound obtained by the reaction between a hydroxyl group containing silicone resin and epichlorohydrin, and a halide thereof.

As the epoxy resin, commercial products can be used, and examples thereof include, for example, an epoxy resin represented by the following formula (24) (NC-3000FH (product name) manufactured by Nippon Kayaku Co., Ltd., $n_7$ is about 4 in the formula (24)) and a naphthalene-based epoxy resin represented by the following formula (25) (HP-4710 (product name) manufactured by DIC CORPORATION).

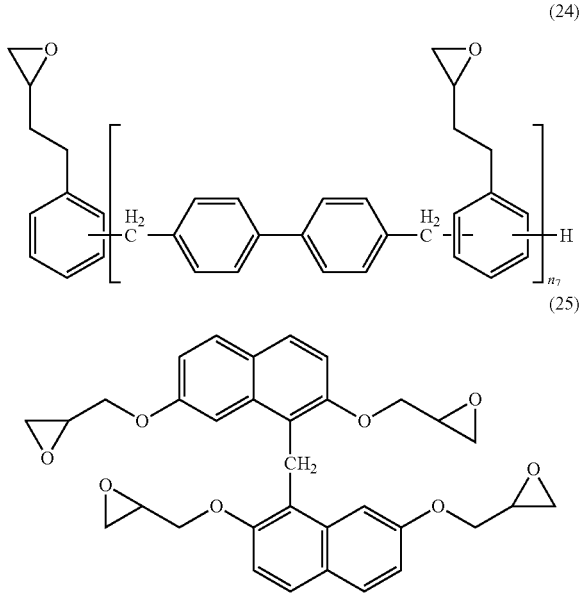

(24)

(25)

The epoxy resin may be used alone as one kind, or may be used as an arbitrary mixture of two or more kinds.

The content of the epoxy resin is preferably 0.01 to 40 parts by mass based on 100 parts by mass of the resin solid content in the resin composition.

<Additional Compound>

Examples of the additional compound include a vinyl ether such as ethyl vinyl ether, propyl vinyl ether, hydroxyethyl vinyl ether, and ethylene glycol divinyl ether; a styrene such as styrene, methylstyrene, ethylstyrene, and divinylbenzene; triallyl isocyanurate, trimethallyl isocyanurate, and bisallylnadic imide. The additional compound may be used alone as one kind, or may be used as an arbitrary mixture of two or more kinds.

The content of the additional compound is preferably 0.01 to 40 parts by mass based on 100 parts by mass of the resin solid content in the resin composition.

<Organic Solvent>

The resin composition of the present embodiment may contain an organic solvent if required. When an organic solvent is used, the viscosity can be adjusted during the preparation of the resin composition. The type of the organic solvent is not particularly limited as long as it is capable of dissolving a part of or all of the resin in the resin composition. Examples of the organic solvent include, for example, a ketone such as acetone, methyl ethyl ketone, and methyl isobutyl ketone; an alicyclic ketone such as cyclopentanone and cyclohexanone; a cellosolve-based solvent such as propylene glycol monomethyl ether and propylene glycol monomethyl ether acetate; an ester-based solvent such as ethyl lactate, methyl acetate, ethyl acetate, butyl acetate, isoamyl acetate, ethyl lactate, methyl methoxypropionate, methyl hydroxyisobutyrate, and γ-butyrolactone; a polar solvent such as an amide such as dimethylacetamide and dimethylformamide; and a nonpolar solvent such as an aromatic hydrocarbon such as toluene and xylene.

The organic solvent may be used alone as one kind, or may be used as an arbitrary mixture of two or more kinds.

The content of the organic solvent is normally 10 to 900 parts by mass based on 100 parts by mass of the components in the resin composition excluding the organic solvent.

<Additional Component>

In the resin composition of the present embodiment, a variety of polymer compounds such as a thermosetting resin, a thermoplastic resin and an oligomer thereof, and an elastomer, which have not been mentioned before; a flame retardant compound, which has not been mentioned before; an additive agent and the like can also be used in combination to the extent that the characteristics of the present embodiment are not impaired. These components are not particularly limited as long as they are generally used. Examples of the flame retardant compound include, for example, a nitrogen containing compound such as melamine and benzoguanamine, an oxazine ring containing compound, and a phosphorus compound such as a phosphate compound, an aromatic fused phosphate ester, and a halogen containing fused phosphate ester. Examples of the additive agent include, for example, an ultraviolet absorbing agent, an antioxidant, a fluorescent brightening agent, a photosensitizer, a dye, a pigment, a thickening agent, a lubricant, a defoaming agent, a surface conditioner, a brightening agent, a polymerization inhibitor, and a heat curing accelerator. The additional components may be used alone as one kind, or may be used as an arbitrary mixture of two or more kinds.

In the resin composition of the present embodiment, the content of each additional component is normally 0.1 to 10 parts by mass based on 100 parts by mass of the resin composition.

<Method for Producing Resin Composition>

The resin composition of the present embodiment is prepared by appropriately mixing the maleimide compound (A), carboxylic acid containing compound (B), and photo initiator (C), and if required, the maleimide compound (D) other than the maleimide compound (A), filler (E), additional resin, additional compound, additional component, organic solvent, and the like. The resin composition of the present embodiment can be suitably used as a varnish upon fabricating a resin sheet of the present embodiment, which will be mentioned later. Note that the organic solvent used in the preparation of the varnish is not particularly limited, and specific examples thereof are as described above.

Examples of the method for producing the resin composition of the present embodiment include, for example, a method in which each of the components described above is sequentially compounded in a solvent and stirred sufficiently.

Upon producing the resin composition, publicly known treatments (stirring, mixing, and kneading treatments and the like) for uniformly dissolving or dispersing each component can be carried out, if required. Specifically, by using a stirring tank equipped with a stirrer having an appropriate stirring capacity to carry out the stirring and dispersion treatment, the dispersibility of each component in the resin composition can be improved. The stirring, mixing, and kneading treatments can be appropriately carried out by using a publicly known apparatus such as a stirring apparatus intended for dispersion such as an ultrasonic homogenizer; an apparatus intended for mixing such as a three roll mill, a ball mill, a bead mill, or a sand mill; or a revolution or rotation mixing apparatus. In addition, upon preparing the resin composition of the present embodiment, an organic solvent can be used, if required. The type of the organic solvent is not particularly limited as long as it is capable of dissolving the resin in the resin composition, and specific examples thereof are as described above.

[Applications]

The resin composition of the present embodiment can be used in applications where an insulation resin composition is required, and the applications are not particularly limited. For example, the resin composition of the present embodiment can be used for applications including a photosensitive film, a photosensitive film with a support, a prepreg, a resin sheet, a circuit substrate (applications for a laminate, applications for a multilayer printed wiring board, and the like), a solder resist, an underfill material, a die bonding material, a semiconductor sealing material, a hole filling resin, and a component embedding resin. Among the above, the resin composition of the present embodiment can be suitably used for an insulation layer of a multilayer printed wiring board or for a solder resist since it has excellent photocurability and alkaline developability.

[Resin Sheet]

A resin sheet of the present embodiment is a resin sheet with a support containing: a support; and a resin layer disposed on one surface or both surfaces of the support, wherein the resin layer contains the resin composition of the present embodiment. The resin sheet can be produced by applying the resin composition onto the support and drying it. The resin layer in the resin sheet of the present embodiment has excellent photocurability and alkaline developability.

As the support, those publicly known can be used and there is no particular limitation thereon, but it is preferably a resin film. Examples of the resin film include, for example, a polyimide film, a polyamide film, a polyester film, a polyethylene terephthalate (PET) film, a polybutylene terephthalate (PBT) film, a polypropylene (PP) film, a polyethylene (PE) film, a polyethylene naphthalate film, a polyvinyl alcohol film, and a triacetyl acetate film. Among the above, a PET film is preferable.

As for the resin film, it is preferable that a release agent should be coated on the surface thereof in order to facilitate release from the resin layer. The thickness of the resin film is preferably in the range of 5 to 100 µm and more preferably in the range of 10 to 50 µm. When the thickness is less than 5 µm, the support tends to be easily torn upon releasing the support to be carried out before alkaline development, and when the thickness is greater than 100 µm, the resolution upon being exposed through the support tends to be reduced.

In addition, in order to reduce light scattering during exposure, it is preferable that the resin film should have excellent transparency.

Furthermore, in the resin sheet in the present embodiment, the resin layer thereof may be protected with a protective film.

By protecting the resin layer side with a protective film, adhesion of dust and the like to the surface of the resin layer and scratches can be prevented. As the protective film, a film composed of a material similar to the resin film can be used. The thickness of the protective film is preferably in the range of 1 to 50 µm and more preferably in the range of 5 to 40 µm. If the thickness is less than 1 µm, the handleability of the protective film tends to be reduced, and if the thickness is greater than 50 µm, the inexpensiveness tends to be poor. Note that it is preferable for the protective film to have a smaller adhesive force between the resin layer and the protective film than the adhesive force between the resin layer and the support.

Examples of the method for producing the resin sheet of the present embodiment include, for example, a method in which the resin composition of the present embodiment is applied to a support such as a PET film and the organic solvent is removed by drying, thereby producing the resin sheet.

The application method can be carried out by a publicly known method using, for example, a roll coater, a comma coater, a gravure coater, a die coater, a bar coater, a lip coater, a knife coater, a squeeze coater, or the like. The drying described above can be carried out by, for example, a method of heating in a dryer at 60 to 200° C. for 1 to 60 minutes.

The amount of organic solvent remaining in the resin layer is preferably less than 5% by mass based on the total mass of the resin layer from the viewpoint of preventing diffusion of the organic solvent in the subsequent steps. It is preferable that the thickness of the resin layer should be 1 to 50 µm from the viewpoint of improving handleability.

The resin sheet of the present embodiment can be used for the production of an insulation layer of a multilayer printed wiring board.

[Multilayer Printed Wiring Board]

A multilayer printed wiring board of the present embodiment contains: an insulation layer; and a conductor layer formed on one surface or both surfaces of the insulation layer, wherein the insulation layer contains the resin composition of the present embodiment. The insulation layer can also be obtained by, for example, laminating one or more of the resin sheets and curing them. As for the numbers of lamination for each of the insulation layer and conductor layer, the numbers of lamination can be set as appropriate depending on the intended application. Also, there is no particular limitation on the order of the insulation layer and the conductor layer. The conductor layer may be a metal foil used for a variety of printed wiring board materials, such as metal foils of copper and aluminum. Examples of the copper metal foil include a copper foil such as a rolled copper foil and an electrolytic copper foil. The thickness of the conductor layer is normally 1 to 100 µm. Specifically, it can be produced by the following method.

(Lamination Step)

In a lamination step, the resin layer side of the resin sheet of the present embodiment is laminated to one surface or both surfaces of a circuit substrate using a vacuum laminator. Examples of the circuit substrate include, for example, a glass epoxy substrate, a metal substrate, a ceramic substrate, a silicon substrate, a semiconductor sealing resin substrate, a polyester substrate, a polyimide substrate, a BT resin substrate, and a thermosetting polyphenylene ether substrate. Note that, in the present embodiment, the circuit substrate refers to a substrate in which a patterned conductor layer (circuit) is formed on one surface or both surfaces of the substrate as described above. Also, in the present embodiment, in a multilayer printed wiring board formed by alternately laminating a conductor layer and an insulation layer, a substrate in which one surface or both surfaces of the outermost layer of the multilayer printed wiring board are patterned conductor layers (circuits) is also included in the circuit substrate. Note that the insulation layer laminated in the multilayer printed wiring board may be an insulation layer obtained by laminating one or more of the resin sheets of the present embodiment and curing them, or it may be an insulation layer obtained by laminating one or more of each of the resin sheets of the present embodiment and publicly known resin sheets different from the resin sheets of the present embodiment. Note that there is no particular limitation on the method for laminating the resin sheet of the present embodiment and a publicly known resin sheet that is different from the resin sheet of the present embodiment. The surface of the conductor layer may be subjected to a blackening treatment and/or a roughening treatment by copper etching or the like in advance. In the lamination step, when the resin sheet has a protective film, the protective film is peeled off and removed. Then, the resin sheet and the circuit substrate are preheated if required, and while pressurizing and heating the resin layer of the resin sheet, it is crimped to the circuit substrate. In the present embodiment, a method of laminating the resin layer of the resin sheet to the circuit substrate under reduced pressure using a vacuum lamination method is suitably used.

As for the conditions of the lamination step, for example, it is preferable to perform the lamination under reduced pressure with a crimping temperature (lamination temperature) of 50 to 140° C., crimping pressure of 1 to 15 kgf/cm$^2$, crimping time of 5 to 300 seconds, and air pressure of 20 mmHg or less. Also, the lamination step may be in a batch type or in a continuous type using a roll. The vacuum lamination method can be carried out using a commercially available vacuum laminator. Examples of the commercially available vacuum laminator include, for example, a two-stage build-up laminator manufactured by Nikko-Materials Co., Ltd.

(Exposure Step)

In an exposure step, after providing the resin layer on the circuit substrate by the lamination step, a predetermined part of the resin layer is irradiated with the active energy ray including a wavelength of 405 nm (h-line) as the light source to cure the resin layer in the irradiated portion. Examples of the active energy ray include, for example, ultraviolet rays. The irradiation amount of the active energy ray including a wavelength of 405 nm (h-line) is approximately 10 to 10,000 mJ/cm$^2$.

The irradiation may be performed through a mask pattern or may be performed by using the direct imaging method in which the irradiation is directly applied. There are two exposure methods for passing through the mask pattern: the contact exposure method, in which the mask pattern is adhered to the multilayer printed wiring board, and the non-contact exposure method, in which parallel light rays are used to perform the exposure without adhering the mask pattern to the multilayer printed wiring board, but either method may be used. Also, when a support is present on the resin layer, it may be exposed from the top of the support, or it may be exposed after the support is removed. In addition, by using the direct imaging method, a printed wiring board having a highly dense and highly detailed wiring formation (pattern) can be produced.

(Alkaline Development Step)

When no support is present on the resin layer, a pattern of the insulation layer can be formed by directly removing the part that has not been photo-cured (unexposed portion) by alkaline development after the exposure step, thereby performing development.

Alternatively, when a support is present on the resin layer, a pattern of the insulation layer can be formed by removing that support after the exposure step and then removing the part that has not been photo-cured (unexposed portion) by alkaline development, thereby performing development.

Since the unexposed resin layer containing the resin composition of the present embodiment has excellent alkaline developability, a printed wiring board with a highly detailed pattern can be obtained.

In the case of the alkaline development described above, there is no particular limitation on the developing solution as long as it selectively elutes the unexposed part, but alkaline developing solutions such as an aqueous solution of tetramethylammonium hydroxide, an aqueous solution of sodium carbonate, an aqueous solution of potassium carbonate, an aqueous solution of sodium hydroxide, and an aqueous solution of potassium hydroxide are used. In the present embodiment, it is particularly preferable to use an aqueous solution of tetramethylammonium hydroxide. The alkaline developing solution may be used alone as one kind, or may be used as an arbitrary mixture of two or more kinds.

Also, the alkaline development method can be performed by a publicly known method such as dipping, paddling, spraying, swinging immersion, brushing, or scrapping. In the pattern formation of the present embodiment, these development methods may be used in combination, if required. Also, the use of a high pressure spray is suitable as the development method because the resolution is further improved. When the spray scheme is adopted, the spray pressure is preferably 0.02 to 0.5 MPa.

(Postbaking Step)

In the present embodiment, a postbaking step is carried out after completion of the above alkaline development step, thereby forming an insulation layer (cured product). Examples of the postbaking step include an ultraviolet irradiation step with a high pressure mercury lamp and a heating step using a clean oven, and these steps may be used in combination as well. When irradiating with ultraviolet ray, the irradiation amount thereof can be adjusted if required, and for example, the irradiation can be carried out at an irradiation amount of approximately 0.05 to 10 J/cm$^2$. Also, the conditions of heating can be appropriately selected if required, but they are preferably selected from the range of 20 to 180 minutes at 150 to 220° C., and more preferably from the range of 30 to 150 minutes at 160 to 200° C.

(Conductor Layer Formation Step)

After forming the insulation layer (cured product), a conductor layer is formed on the surface of the insulation layer by dry plating. For the dry plating, a publicly known method such as a vapor deposition method, a sputtering method, and an ion plating method can be used. In the vapor deposition method (vacuum deposition method), for example, a metallic film can be formed on the insulation layer by placing the multilayer printed wiring board in a vacuum container and heating and evaporating the metal. In the sputtering method as well, for example, the multilayer printed wiring board is placed in a vacuum container, an inert gas such as argon is introduced, a direct current voltage is applied, the ionized inert gas is brought into collision with the target metal, and the knocked-out metal can be used to form a metallic film on the insulation layer.

Next, a conductor layer is formed by nonelectrolytic plating or electroplating. As a method of subsequent pattern formation, for example, a subtractive method, a semi-additive method, or the like can be used.

[Semiconductor Device]

A semiconductor device of the present embodiment contains the resin composition of the present embodiment. Specifically, it can be produced by the following method. A semiconductor device can be produced by mounting a semiconductor chip at the conduction points on the multilayer printed wiring board of the present embodiment. Here, the conduction points refer to the points in the multilayer printed wiring board where electrical signals are conveyed, and the locations thereof may be on the surface or at embedded points. In addition, the semiconductor chip is not particularly limited as long as they are electrical circuit elements made of semiconductors.

Although the method for mounting the semiconductor chip upon producing the semiconductor device of the present embodiment is not particularly limited as long as the semiconductor chip effectively functions, specific examples thereof include a wire bonding mounting method, a flip chip mounting method, a mounting method with a bumpless build-up layer (BBUL), a mounting method with an anisotropic conductive film (ACF), and a mounting method with a non-conductive film (NCF).

Alternatively, the semiconductor device can be produced by forming an insulation layer containing the resin composition of the present embodiment on a semiconductor chip or a substrate on which the semiconductor chip is mounted. The shape of the substrate on which semiconductor chip is mounted may be wafer-like or panel-like. After the formation, the semiconductor device can be produced using the same method as the multilayer printed wiring board described above.

EXAMPLES

Hereinafter, the present embodiment will be more specifically described with reference to Examples and Comparative Examples. The present embodiment is not limited in any way by the following Examples.
[Evaluation of Materials]
[Transmittance and Absorbance]

By using BMI-689 (product name, mass average molecular weight (Mw): 689) manufactured by Designer Molecules Inc. as the maleimide compound (A), a chloroform solution containing this BMI-689 (product name) at 1% by mass was prepared, and measurement of the transmittance at a wavelength of 405 nm was carried out using an UV-vis measuring apparatus (Hitachi spectrophotometer U-4100 (product name) manufactured by Hitachi High-Technologies Corporation).

In the same manner, by using BMI-1000P (product name, $n_1$ is 13.6 (average value) in the formula (10), mass average molecular weight (Mw): 1338) manufactured by K-I Chemical Industry Co., LTD. as the maleimide compound (A), measurement of the transmittance at a wavelength of 405 nm was carried out.

By using 4-aminobenzoic acid (manufactured by Tokyo Chemical Industry Co., Ltd.) as the carboxylic acid containing compound (B), a N-methylpyrrolidone solution containing this 4-aminobenzoic acid at 1% by mass was prepared, and measurement of the transmittance at a wavelength of 405 nm was carried out using an UV-vis measuring apparatus (U-4100 (product name)).

In the same manner, by using salicylic acid (manufactured by Tokyo Chemical Industry Co., Ltd.), piperidinecarboxylic acid (manufactured by Tokyo Chemical Industry Co., Ltd.), phthalic acid (manufactured by Tokyo Chemical Industry Co., Ltd.), trimellitic acid (manufactured by Tokyo Chemical Industry Co., Ltd.), pyromellitic acid (manufactured by Tokyo Chemical Industry Co., Ltd.), cis-4-cyclohexene-1,2-dicarboxylic acid (manufactured by Tokyo Chemical Industry Co., Ltd.), cis-4-cyclohexene-1,2-dicarboxylic anhydride (manufactured by Tokyo Chemical Industry Co., Ltd.), and 1,2-phenylenediacetic acid (manufactured by Tokyo Chemical Industry Co., Ltd.) as the carboxylic acid containing compound (B), measurement of the transmittance at a wavelength of 405 nm was carried out.

By using bis(2,4,6-trimethylbenzoyl)-phenylphosphine oxide (Omnirad (registered trademark) 819 (product name) manufactured by IGM Resins B.V.) as the photo initiator (C), a chloroform solution containing this Omnirad (registered trademark) 819 (product name) at 1% by mass was prepared, and measurement of the absorbance at a wavelength of 405 nm was carried out using an UV-vis measuring apparatus (U-4100 (product name)).

In the same manner, by using 2-benzyl-2-dimethylamino-1-(4-morpholinophenyl)-butanone-1 (Omnirad (registered trademark) 369 (product name) manufactured by IGM Resins B.V.) and 2-methyl-1-[4-(methylthio)phenyl]-2-morpholinopropan-1-one (Omnirad (registered trademark) 907 (product name) manufactured by IGM Resins B.V.) as the photo initiator, measurement of the absorbance at a wavelength of 405 nm was carried out.

The results are shown in Table 1.

| | | 405 nm Insmittance [%] | 405 nm Absorbance [—] |
|---|---|---|---|
| Maleimide compound (A) | BMI-689 | 72 | — |
| | BMI-1000P | 18 | — |
| Carboxylic acid containing compound (B) | 4-Aminobenzoic acid | 98 | — |
| | Salicylic acid | 98 | — |
| | Piperdinecarboxylic acid | 98 | — |
| | Phthalic acid | 100 | — |
| | Trimellitic acid | 100 | — |
| | Pyromellitic acid | 99 | — |
| | cis-4-Cyclohexene-1,2-dicarboxylic acid | 100 | — |
| | cis-4-Cyclohexene-1,2-dicarboxylic anhydride | 98 | — |
| | 1,2-Phenylenediacetic acid | 81 | — |
| Photo initiator (C) | Omnirad819 | — | 0.26 |
| Photo initiator | Omnirad369 | — | 0.04 |
| | Omnirad907 | — | 0 |

Example 1

(Fabrication of Resin Composition and Resin Sheet)

100 parts by mass of BMI-689 (product name) as the maleimide compound (A), 20 parts by mass of 4-aminobenzoic acid as the carboxylic acid containing compound (B), and 6 parts by mass of bis(2,4,6-trimethylbenzoyl)-phenylphosphine oxide (Omnirad (registered trademark) 819 (product name)) as the photo initiator (C) were mixed with 84 parts by mass of methyl ethyl ketone as the organic solvent, and by stirring the mixture with an ultrasonic homogenizer, a varnish (solution of the resin composition) was obtained. This varnish was applied onto a PET film with a thickness of 38 μm (Unipeel (registered trademark) TR1-38 (product name) manufactured by UNITIKA LTD.) using an auto film applicator (PI-1210, manufactured by TESTER SANGYO CO., LTD.) and heated and dried at 90° C. for 5 minutes, thereby obtaining a resin sheet having the PET film as a support and a resin layer with a thickness of 30 μm.

(Fabrication of Inner Layer Circuit Substrate)

After forming an inner layer circuit in a BT (bismaleimide-triazine) resin laminate with a glass cloth base material, both surfaces of which were copper clad (copper foil thickness of 18 μm, thickness of 0.2 mm, CCL (registered trademark)-HL832NS (product name) manufactured by Mitsubishi Gas Chemical Company, Inc.), both surfaces were subjected to a roughening treatment for copper surfaces with CZ8100 (product name) manufactured by MEC Co., Ltd., thereby obtaining an inner layer circuit substrate.

(Fabrication of Resin for Evaluation)

The resin surfaces of the resin sheets described above were pasted together, and a vacuum laminator (manufactured by Nikko-Materials Co., Ltd.) was used to perform vacuum drawing (5.0 MPa or less) for 30 seconds, followed by lamination molding at a pressure of 10 kgf/cm² and a temperature of 70° C. for 30 seconds. Furthermore, by performing lamination molding at a pressure of 7 kgf/cm² and a temperature of 70° C. for 60 seconds, a resin for evaluation with supports on both surfaces was obtained.

(Fabrication of Laminate for Evaluation)

The resin surface of the resin sheet described above was disposed on the inner layer circuit substrate described above, and a vacuum laminator (manufactured by Nikko-Materials Co., Ltd.) was used to perform vacuum drawing (5.0 hPa or less) for 30 seconds, followed by lamination molding at a pressure of 10 kgf/cm² and a temperature of 70° C. for 30 seconds. Furthermore, by performing lamination molding at a pressure of 10 kgf/cm² and a temperature of 70° C. for 60 seconds, a laminate for evaluation in which the inner layer circuit substrate, the resin layer, and the support were laminated was obtained.

Example 2

A varnish and a resin sheet were obtained in the same manner as in Example 1 except that 20 parts by mass of salicylic acid was used as the carboxylic acid containing compound (B) instead of 20 parts by mass of 4-aminobenzoic acid. In addition, by using this resin sheet, a resin for evaluation and a laminate for evaluation were obtained in the same manner as in Example 1.

Example 3

A varnish and a resin sheet were obtained in the same manner as in Example 1, except that 100 parts by mass of BMI-1000P (product name) was used as the maleimide compound (A) instead of 100 parts by mass of BMI-689 (product name), 0.02 parts by mass of 4-aminobenzoic acid was used as the carboxylic acid containing compound (B) instead of 20 parts by mass of 4-aminobenzoic acid, and 5 parts by mass of Omnirad (registered trademark) 819 (product name) was used as the photo initiator (C) instead of 6 parts by mass of Omnirad (registered trademark) 819 (product name). Also, by using this resin sheet, a resin for evaluation and a laminate for evaluation were obtained in the same manner as in Example 1.

Example 4

A varnish and a resin sheet were obtained in the same manner as in Example 1, except that 100 parts by mass of BMI-1000P (product name) was used as the maleimide compound (A) instead of 100 parts by mass of BMI-689 (product name), 0.2 parts by mass of 4-aminobenzoic acid was used as the carboxylic acid containing compound (B) instead of 20 parts by mass of 4-aminobenzoic acid, and 5 parts by mass of Omnirad (registered trademark) 819 (product name) was used as the photo initiator (C) instead of 6 parts by mass of Omnirad (registered trademark) 819 (product name). Moreover, by using this resin sheet, a resin for evaluation and a laminate for evaluation were obtained in the same manner as in Example 1.

Example 5

A varnish and a resin sheet were obtained in the same manner as in Example 1, except that 100 parts by mass of BMI-1000P (product name) was used as the maleimide compound (A) instead of 100 parts by mass of BMI-689 (product name), 2 parts by mass of 4-aminobenzoic acid was used as the carboxylic acid containing compound (B) instead of 20 parts by mass of 4-aminobenzoic acid, and 5 parts by mass of Omnirad (registered trademark) 819 (product name) was used as the photo initiator (C) instead of 6 parts by mass of Omnirad (registered trademark) 819 (product name). Furthermore, by using this resin sheet, a resin for evaluation and a laminate for evaluation were obtained in the same manner as in Example 1.

Example 6

A varnish and a resin sheet were obtained in the same manner as in Example 1 except that 100 parts by mass of BMI-1000P (product name) was used as the maleimide compound (A) instead of 100 parts by mass of BMI-689 (product name), 10 parts by mass of 4-aminobenzoic acid was used as the carboxylic acid containing compound (B) instead of 20 parts by mass of 4-aminobenzoic acid, and 5 parts by mass of Omnirad (registered trademark) 819 (product name) was used as the photo initiator (C) instead of 6 parts by mass of Omnirad (registered trademark) 819 (product name). Besides, by using this resin sheet, a resin for evaluation and a laminate for evaluation were obtained in the same manner as in Example 1.

Example 7

A varnish and a resin sheet were obtained in the same manner as in Example 1 except that 100 parts by mass of BMI-1000P (product name) was used as the maleimide compound (A) instead of 100 parts by mass of BMI-689 (product name), 20 parts by mass of 4-aminobenzoic acid was used as the carboxylic acid containing compound (B) instead of 20 parts by mass of 4-aminobenzoic acid, and 5 parts by mass of Omnirad (registered trademark) 819 (product name) was used as the photo initiator (C) instead of 6 parts by mass of Omnirad (registered trademark) 819 (product name). In addition, by using this resin sheet, a resin for evaluation and a laminate for evaluation were obtained in the same manner as in Example 1.

Example 8

100 parts by mass of BMI-1000P (product name) as the maleimide compound (A), 2 parts by mass of salicylic acid as the carboxylic acid containing compound (B), and 5 parts by mass of bis(2,4,6-trimethylbenzoyl)-phenylphosphine oxide (Omnirad (registered trademark) 819 (product name)) as the photo initiator (C) were mixed with 71 parts by mass of methyl ethyl ketone as the organic solvent, and by stirring the mixture with an ultrasonic homogenizer, a varnish (solution of the resin composition) was obtained. By using this varnish, a resin sheet was obtained in the same manner as in Example 1. By using this, a resin for evaluation and a laminate for evaluation were obtained in the same manner as in Example 1.

Example 9

A varnish and a resin sheet were obtained in the same manner as in Example 8, except that 10 parts by mass of salicylic acid was used as the carboxylic acid containing compound (B) instead of 2 parts by mass of salicylic acid. Also, by using this resin sheet, a resin for evaluation and a laminate for evaluation were obtained in the same manner as in Example 1.

Example 10

A varnish and a resin sheet were obtained in the same manner as in Example 8, except that 20 parts by mass of salicylic acid was used as the carboxylic acid containing compound (B) instead of 2 parts by mass of salicylic acid. Moreover, by using this resin sheet, a resin for evaluation and a laminate for evaluation were obtained in the same manner as in Example 1.

Example 11

A varnish and a resin sheet were obtained in the same manner as in Example 8, except that 2 parts by mass of piperidinecarboxylic acid was used as the carboxylic acid containing compound (B) instead of 2 parts by mass of salicylic acid. Furthermore, by using this resin sheet, a resin for evaluation and a laminate for evaluation were obtained in the same manner as in Example 1.

Example 12

A varnish and a resin sheet were obtained in the same manner as in Example 8 except that 10 parts by mass of piperidinecarboxylic acid was used as the carboxylic acid containing compound (B) instead of 2 parts by mass of salicylic acid. Besides, by using this resin sheet, a resin for evaluation and a laminate for evaluation were obtained in the same manner as in Example 1.

Example 13

A varnish and a resin sheet were obtained in the same manner as in Example 8 except that 20 parts by mass of piperidinecarboxylic acid was used as the carboxylic acid containing compound (B) instead of 2 parts by mass of salicylic acid. In addition, by using this resin sheet, a resin for evaluation and a laminate for evaluation were obtained in the same manner as in Example 1.

Example 14

100 parts by mass of BMI-689 (product name) as the maleimide compound (A), 5 parts by mass of phthalic acid as the carboxylic acid containing compound (B), and 5 parts by mass of bis(2,4,6-trimethylbenzoyl)-phenylphosphine oxide (Omnirad (registered trademark) 819 (product name)) as the photo initiator (C) were mixed with 73 parts by mass of methyl ethyl ketone as the organic solvent, and by stirring the mixture with an ultrasonic homogenizer, a varnish (solution of the resin composition) was obtained. By using this varnish, a resin sheet was obtained in the same manner as in Example 1. By using this, a resin for evaluation and a laminate for evaluation were obtained in the same manner as in Example 1.

Example 15

A varnish and a resin sheet were obtained in the same manner as in Example 14 except that 5 parts by mass of trimellitic acid was used as the carboxylic acid containing compound (B) instead of 5 parts by mass of phthalic acid. Also, by using this resin sheet, a resin for evaluation and a laminate for evaluation were obtained in the same manner as in Example 1.

Example 16

A varnish and a resin sheet were obtained in the same manner as in Example 14 except that 5 parts by mass of pyromellitic acid was used as the carboxylic acid containing compound (B) instead of 5 parts by mass of phthalic acid. Moreover, by using this resin sheet, a resin for evaluation and a laminate for evaluation were obtained in the same manner as in Example 1.

Example 17

A varnish and a resin sheet were obtained in the same manner as in Example 14 except that 5 parts by mass of cis-4-cyclohexene-1,2-dicarboxylic acid was used as the carboxylic acid containing compound (B) instead of 5 parts by mass of phthalic acid. Furthermore, by using this resin sheet, a resin for evaluation and a laminate for evaluation were obtained in the same manner as in Example 1.

Example 18

A varnish and a resin sheet were obtained in the same manner as in Example 14 except that 5 parts by mass of cis-4-cyclohexene-1,2-dicarboxylic anhydride was used as the carboxylic acid containing compound (B) instead of 5 parts by mass of phthalic acid. Besides, by using this resin sheet, a resin for evaluation and a laminate for evaluation were obtained in the same manner as in Example 1.

Example 19

A varnish and a resin sheet were obtained in the same manner as in Example 14 except that 5 parts by mass of 1,2-phenylenediacetic acid was used as the carboxylic acid containing compound (B) instead of 5 parts by mass of phthalic acid. In addition, by using this resin sheet, a resin for evaluation and a laminate for evaluation were obtained in the same manner as in Example 1.

Comparative Example 1

100 parts by mass of BMI-689 (product name) as the maleimide compound and 6 parts by mass of bis(2,4,6-trimethylbenzoyl)-phenylphosphine oxide (Omnirad (registered trademark) 819 (product name)) as the photo initiator were mixed with 71 parts by mass of methyl ethyl ketone as the organic solvent, and by stirring the mixture with an ultrasonic homogenizer, a varnish (solution of the resin composition) was obtained. By using this varnish, a resin sheet was obtained in the same manner as in Example 1. By using this, a resin for evaluation and a laminate for evaluation were obtained in the same manner as in Example 1.

Comparative Example 2

A varnish and a resin sheet were obtained in the same manner as in Comparative Example 1 except that 100 parts by mass of BMI-1000P (product name) was used as the maleimide compound instead of 100 parts by mass of BMI-689 (product name). Also, by using this resin sheet, a resin for evaluation and a laminate for evaluation were obtained in the same manner as in Example 1.

Comparative Example 3

A varnish and a resin sheet were obtained in the same manner as in Comparative Example 1 except that 6 parts by mass of 2-benzyl-2-dimethylamino-1-(4-morpholinophenyl)-butanone-1 (Omnirad (registered trademark) 369 (product name)) was used instead of 6 parts by mass of Omnirad (registered trademark) 819 (product name). Moreover, by using this resin sheet, a resin for evaluation and a laminate for evaluation were obtained in the same manner as in Example 1.

Comparative Example 4

A varnish and a resin sheet were obtained in the same manner as in Comparative Example 1 except that 6 parts by mass of 2-methyl-1-[4-(methylthio)phenyl]-2-morpholino-propan-1-one (Omnirad (registered trademark) 907 (product name)) was used instead of 6 parts by mass of Omnirad (registered trademark) 819 (product name). Furthermore, by using this resin sheet, a resin for evaluation and a laminate for evaluation were obtained in the same manner as in Example 1.

[Measurement and Evaluation of Physical Properties]

The resins for evaluation and the laminates for evaluation were measured and evaluated in accordance with the following methods. The results are shown in Tables 2 to 4 and FIG. 1.

[Photocurability]

By using a photo DSC (DSC-2500 (brand name) manufactured by TA Instruments Japan Inc.) equipped with a light source (Omnicure (registered trademark) S2000 (product name) manufactured by U-VIX Corporation) that is capable of irradiating with the active energy ray including a wavelength of 405 nm (h-line), the obtained resin for evaluation was irradiated with the active energy ray including a wavelength of 405 nm (h-line) at an illuminance of 30 mW and for an exposure time of 3.5 minutes, thereby obtaining a graph of time (sec) on the horizontal axis and heat flow (mW) on the vertical axis. The enthalpy (J/g) was defined as the peak area when a line was drawn horizontally from the endpoint of the graph. The curability was evaluated in accordance with the following criteria.

"AA": The enthalpy was 1 (J/g) or more.
"CC": The enthalpy was less than 1 (J/g).

Note that an enthalpy of 1 (J/g) or more means that the curing of the resin is sufficiently advanced by exposure in a predetermined wavelength.

[Alkaline Developability]

The obtained laminate for evaluation was irradiated from the top of the support with a light source (MA-20 (product name) manufactured by Mikasa Co., Ltd.) that is capable of irradiating with the active energy ray including a wavelength of 405 nm (h-line) at an irradiation amount of 200 mJ/cm$^2$, thereby exposing a half of the resin layer (200 mJ) and leaving the rest unexposed. After that, the support (PET film) was peeled off and shaken in a 2.38% aqueous TMAH (tetramethylammonium hydroxide) solution (developing solution, Tokuyama Corporation) for 90 seconds. At that time, the developability was checked after shaking for 60 seconds, and if there remained any undissolved residue, shaking was carried out for another 30 seconds. The alkaline developability was visually evaluated in accordance with the following criteria.

"AA": The exposed portion is insoluble, but the unexposed portion is dissolved after shaking for 60 seconds.

"BB": The exposed portion is insoluble, but the unexposed portion is not fully dissolved after shaking for 60 seconds and is dissolved after shaking for 90 seconds.

"CC": The exposed portion and the unexposed portion are both insoluble.

Also, photographs after alkaline development carried out using the respective resin sheets obtained in Example 1 and Comparative Example 1 are shown in FIG. 1.

TABLE 2

|  |  | Example 1 | Example 2 | Example 3 | Example 4 | Example 5 | Example 6 | Example 7 |
|---|---|---|---|---|---|---|---|---|
| Maleimide compound (A) | BMI-689 | 100 | 100 |  |  |  |  |  |
|  | BMI-1000P |  |  | 100 | 100 | 100 | 100 | 100 |
| Carboxylic acid containing conpound (B) | 4-Aminobenzoic acid | 20 |  |  | 0.02 | 0.2 | 2 | 10 | 20 |
|  | Salicylic acid |  | 20 |  |  |  |  |  |
| Photo initiator (C) | Omnirad819 | 6 | 6 | 5 | 5 | 5 | 5 | 5 |
| Evaluation results | Photocurability | AA | AA | AA | AA | AA | AA | AA |
|  | Alkaline developability | BB | BB | BB | BB | BB | BB | BB |

TABLE 3

|  |  | Example 8 | Example 9 | Example 10 | Example 11 | Example 12 | Example 13 | Example 14 | Example 15 | Example 16 | Example 17 | Example 18 | Example 19 |
|---|---|---|---|---|---|---|---|---|---|---|---|---|---|
| Maleimide compound (A) | BMI-689 |  |  |  |  |  |  | 100 | 100 | 100 | 100 | 100 | 100 |
|  | BMI-1000P | 100 | 100 | 100 | 100 | 100 | 100 |  |  |  |  |  |  |
|  | Sailicylic acid | 2 | 10 | 20 |  |  |  |  |  |  |  |  |  |
|  | Piperidinecarboxylic acid |  |  |  | 2 | 10 | 20 |  |  |  |  |  |  |
|  | Phthalic acid |  |  |  |  |  |  | 5 |  |  |  |  |  |
|  | Trimellitic acid |  |  |  |  |  |  |  | 5 |  |  |  |  |
|  | Pyromellitic acid |  |  |  |  |  |  |  |  | 5 |  |  |  |
|  | cis-4-Cyclohexene-1,2-dicarboxylic acid |  |  |  |  |  |  |  |  |  | 5 |  |  |
|  | cis-4-Cyclohexene-1,2-dicarboxylic anhydride |  |  |  |  |  |  |  |  |  |  | 5 |  |
|  | 1,2-Phenylenediacetic acid |  |  |  |  |  |  |  |  |  |  |  | 5 |
| Photo initiator (C) | Omnirad819 | 5 | 5 | 5 | 5 | 5 | 5 | 5 | 5 | 5 | 5 | 5 | 5 |
| Evaluation results | Photocurability | AA | AA | AA | AA | AA | AA | AA | AA | AA | AA | AA | AA |
|  | Alkaline developability | BB | BB | BB | BB | BB | BB | AA | AA | AA | AA | AA | AA |

|  | | Comparative Example 1 | Comparative Example 2 | Comparative Example 3 | Comparative Example 4 |
|---|---|---|---|---|---|
| Maleimide compound (A) | BMI-689 | 100 | | 100 | 100 |
|  | BMI-1000P | | 100 | | |
| Carboxylic acid containing compound (B) | 4-Aminobenzoic acid | | | 20 | 20 |
| Photo initiator (C) | Omnirad819 | 6 | 6 | | |
| Photo initiator | Omnirad369 | | | 6 | |
|  | Omnirad907 | | | | 6 |
| Evaluation results | Photocurability | AA | AA | CC | CC |
|  | Alkaline developability | CC | CC | BB | BB |

As is evident from Tables 2 to 4, the resin compositions of the present embodiment are light-sensitive well and are capable of being photo-cured when exposed with the active energy ray including a wavelength of 405 nm (h-line). In addition, the unexposed portion has excellent alkaline developability, as shown in Tables 2 to 4 and FIG. 1.

The present application is based on Japanese Patent Application No. 2019-008389 filed on Jan. 22, 2019, the contents of which are incorporated herein by reference.

INDUSTRIAL APPLICABILITY

The resin composition of the present invention has excellent photocurability and alkaline developability, and therefore it is suitable for applications where an insulation resin composition is required. Examples of such applications include, for example, a photosensitive film, a photosensitive film with a support, a prepreg, a resin sheet, a circuit substrate (applications for a laminate, applications for a multilayer printed wiring board, and the like), a solder resist, an underfill material, a die bonding material, a semiconductor sealing material, a hole filling resin, and a component embedding resin.

The invention claimed is:

1. A resin composition comprising:

a maleimide compound (A) having a transmittance of 5% or more at a wavelength of 405 nm (h-line);

at least one carboxylic acid containing compound (B) selected from a compound represented by the following formula (1), a compound represented by the following formula (2), a compound represented by the following formula (3), and a compound represented by the following formula (4); and a photo initiator (C) comprising a compound represented by the following formula (8):

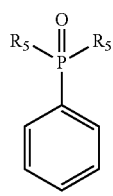
(8)

wherein each $R_5$ independently represents a substituent represented by the following formula (9) or a phenyl group:

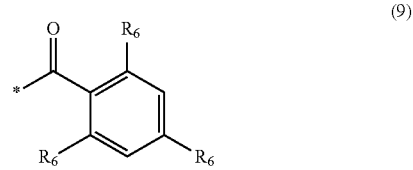
(9)

wherein -* represents a bonding hand and each $R_6$ independently represents a hydrogen atom or a methyl group;

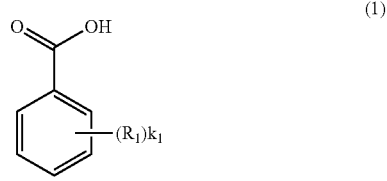
(1)

wherein each $R_1$ independently represents a hydrogen atom, a hydroxyl group, a carboxy group, an amino group, or an aminomethyl group; each $k_1$ independently represents an integer of 1 to 5; and when the formula (1) has two or more carboxy groups, the formula (1) may be an acid anhydride formed by linking the two or more carboxy groups to each other,

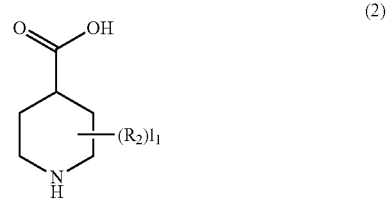
(2)

wherein each $R_2$ independently represents a hydrogen atom, a hydroxyl group, a carboxy group, a carboxymethyl group, an amino group, or an aminomethyl group; each $l_1$ independently represents an integer of 1 to 9; when the formula (2) has two or more carboxy groups, the formula (2) may be an acid anhydride formed by linking the two or more carboxy groups to each other; and when the formula (2) has a carboxymethyl group, the formula (2) may be an acid anhydride formed by linking a carboxymethyl group and a carboxy group to each other,

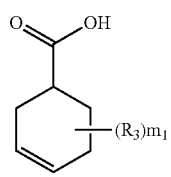

(3)

wherein each $R_3$ independently represents a hydrogen atom, a hydroxyl group, a carboxy group, a carboxymethyl group, an amino group, or an aminomethyl group; each $m_1$ independently represents an integer of 1 to 9; when the formula (3) has two or more carboxy groups, the formula (3) may be an acid anhydride formed by linking the two or more carboxy groups to each other; and when the formula (3) has a carboxymethyl group, the formula (3) may be an acid anhydride formed by linking a carboxymethyl group and a carboxy group to each other, and

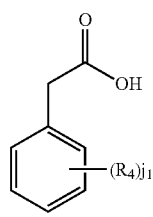

(4)

wherein each $R_4$ independently represents a hydrogen atom, a hydroxyl group, a carboxy group, a carboxymethyl group, an amino group, or an aminomethyl group; each $j_1$ independently represents an integer of 1 to 5; when the formula (4) has one or more carboxy groups, the formula (4) may be an acid anhydride formed by linking a carboxymethyl group and a carboxy group to each other; when the formula (4) has two or more carboxy groups, the formula (4) may be an acid anhydride formed by linking the two or more carboxy groups to each other; and when the formula (4) has two or more carboxymethyl groups, the formula (4) may be an acid anhydride formed by linking the two or more carboxymethyl groups to each other, wherein the resin composition is light-sensitive and photocurable when exposed with an active energy ray including a wavelength of 405 nm (h-line), and has alkaline developability.

2. The resin composition according to claim 1, wherein the carboxylic acid containing compound (B) is contained at 0.01 to 60 parts by mass based on 100 parts by mass of the maleimide compound (A).

3. The resin composition according to claim 1, wherein the carboxylic acid containing compound is at least one selected from a compound represented by the following formula (5), a compound represented by the following formula (6), and a compound represented by the following formula (7):

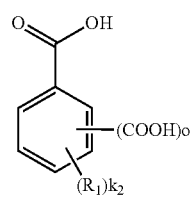

(5)

wherein each $R_1$ independently represents a hydrogen atom, a hydroxyl group, an amino group, or an aminomethyl group; each $k_2$ independently represents an integer of 0 to 4; o represents an integer of $(5-k_2)$; and the formula (5) may be an acid anhydride formed by linking two or more carboxy groups to each other,

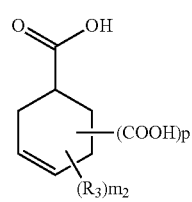

(6)

wherein each $R_3$ independently represents a hydrogen atom, a hydroxyl group, a carboxymethyl group, an amino group, or an aminomethyl group; each $m_2$ independently represents an integer of 0 to 8; p represents an integer of $(9-m_2)$; the formula (6) may be an acid anhydride formed by linking carboxy groups to each other; and when the formula (6) has a carboxymethyl group, the formula (6) may be an acid anhydride formed by linking a carboxymethyl group and a carboxy group to each other, and

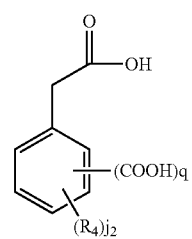

(7)

wherein each $R_4$ independently represents a hydrogen atom, a hydroxyl group, a carboxymethyl group, an amino group, or an aminomethyl group; each $j_2$ independently represents an integer of 0 to 4; q represents an integer of $(5-j_2)$; the formula (7) may be an acid anhydride formed by linking a carboxymethyl group and a carboxy group to each other; when the formula (7) has two or more carboxy groups, the formula (7) may be an acid anhydride formed by linking the two or more carboxy groups to each other; and when the formula (7) has two or more carboxymethyl groups, the formula (7) may be an acid anhydride formed by linking the two or more carboxymethyl groups to each other.

4. The resin composition according to claim 1, wherein the maleimide compound (A) comprises a bismaleimide compound.

5. A resin sheet comprising:
a support; and
a resin layer disposed on one surface or both surfaces of the support,
wherein the resin layer comprises the resin composition according to claim 1.

6. The resin sheet according to claim 5, wherein the resin layer has a thickness of 1 to 50 μm.

7. A multilayer printed wiring board comprising:
an insulation layer; and
a conductor layer formed on one surface or both surfaces of the insulation layer,
wherein the insulation layer comprises the resin composition according to claim 1.

8. A semiconductor device comprising the resin composition according to claim 1.

* * * * *